(12) United States Patent
Nair et al.

(10) Patent No.: US 11,037,892 B2
(45) Date of Patent: Jun. 15, 2021

(54) SUBSTRATE DIELECTRIC WAVEGUIDES IN SEMICONDUCTOR PACKAGES

(71) Applicant: Intel Corporation, Santa Clara, CA (US)

(72) Inventors: Vijay K. Nair, Mesa, AZ (US); Sasha N. Oster, Chandler, AZ (US); Johanna M. Swan, Scottsdale, AZ (US); Telesphor Kamgaing, Chandler, AZ (US); Georgios C. Dogiamis, Chandler, AZ (US); Adel A. Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/465,545

(22) PCT Filed: Dec. 30, 2016

(86) PCT No.: PCT/US2016/069376
§ 371 (c)(1),
(2) Date: May 30, 2019

(87) PCT Pub. No.: WO2018/125183
PCT Pub. Date: Jul. 5, 2018

(65) Prior Publication Data
US 2020/0098710 A1    Mar. 26, 2020

(51) Int. Cl.
*H01L 23/66* (2006.01)
*H01L 23/538* (2006.01)
*H01P 3/16* (2006.01)

(52) U.S. Cl.
CPC ......... *H01L 23/66* (2013.01); *H01L 23/5381* (2013.01); *H01P 3/16* (2013.01)

(58) Field of Classification Search
None
See application file for complete search history.

(56) References Cited

U.S. PATENT DOCUMENTS

| | | | |
|---|---|---|---|
| 8,041,159 B2 * | 10/2011 | Yanagisawa | G02B 6/4214 385/14 |
| 8,437,584 B2 * | 5/2013 | Matsuoka | G02B 6/43 385/14 |

(Continued)

FOREIGN PATENT DOCUMENTS

JP    20061236370    5/2006

OTHER PUBLICATIONS

International Search Report and Written Opinion from related matter PCT/US2016/069376 dated Sep. 20, 2017.

(Continued)

*Primary Examiner* — Karen Kusumakar
(74) *Attorney, Agent, or Firm* — Schwabe, Williamson & Wyatt, P.C.

(57) ABSTRACT

Waveguides disposed in either an interposer layer or directly in the semiconductor package substrate may be used to transfer signals between semiconductor dies coupled to the semiconductor package. For example, inter-semiconductor die communications using mm-wave carrier signals launched into waveguides specifically tuned to optimize transmission parameters of such signals. The use of such high frequencies beneficially provides for reliable transmission of modulated high data rate signals with lower losses than conductive traces and less cross-talk. The use of mm-wave waveguides provides higher data transfer rates per bump for bump-limited dies as well as beneficially providing improved signal integrity even at such higher data transfer rates. Such mm-wave waveguides may be built directly into semiconductor package layers or may be incorporated into one or more interposed layers that are physi- (Continued)

cally and communicably coupled between the semiconductor dies and the semiconductor package substrate.

25 Claims, 14 Drawing Sheets

(56) References Cited

U.S. PATENT DOCUMENTS

| | | | |
|---|---|---|---|
| 2003/0103712 A1* | 6/2003 | Glebov | G02B 6/12004 |
| | | | 385/14 |
| 2004/0208416 A1 | 10/2004 | Chakravorty et al. | |
| 2008/0317402 A1* | 12/2008 | Kodama | H05K 1/0274 |
| | | | 385/14 |
| 2009/0003762 A1 | 1/2009 | Chiniwalla et al. | |
| 2009/0028497 A1* | 1/2009 | Kodama | H05K 1/0274 |
| | | | 385/14 |
| 2016/0111766 A1* | 4/2016 | Takeda | H01P 3/16 |
| | | | 333/239 |

OTHER PUBLICATIONS

International Preliminary Report on Patentability from related matter PCT/US2016/069376 dated Jul. 2, 2019.

* cited by examiner

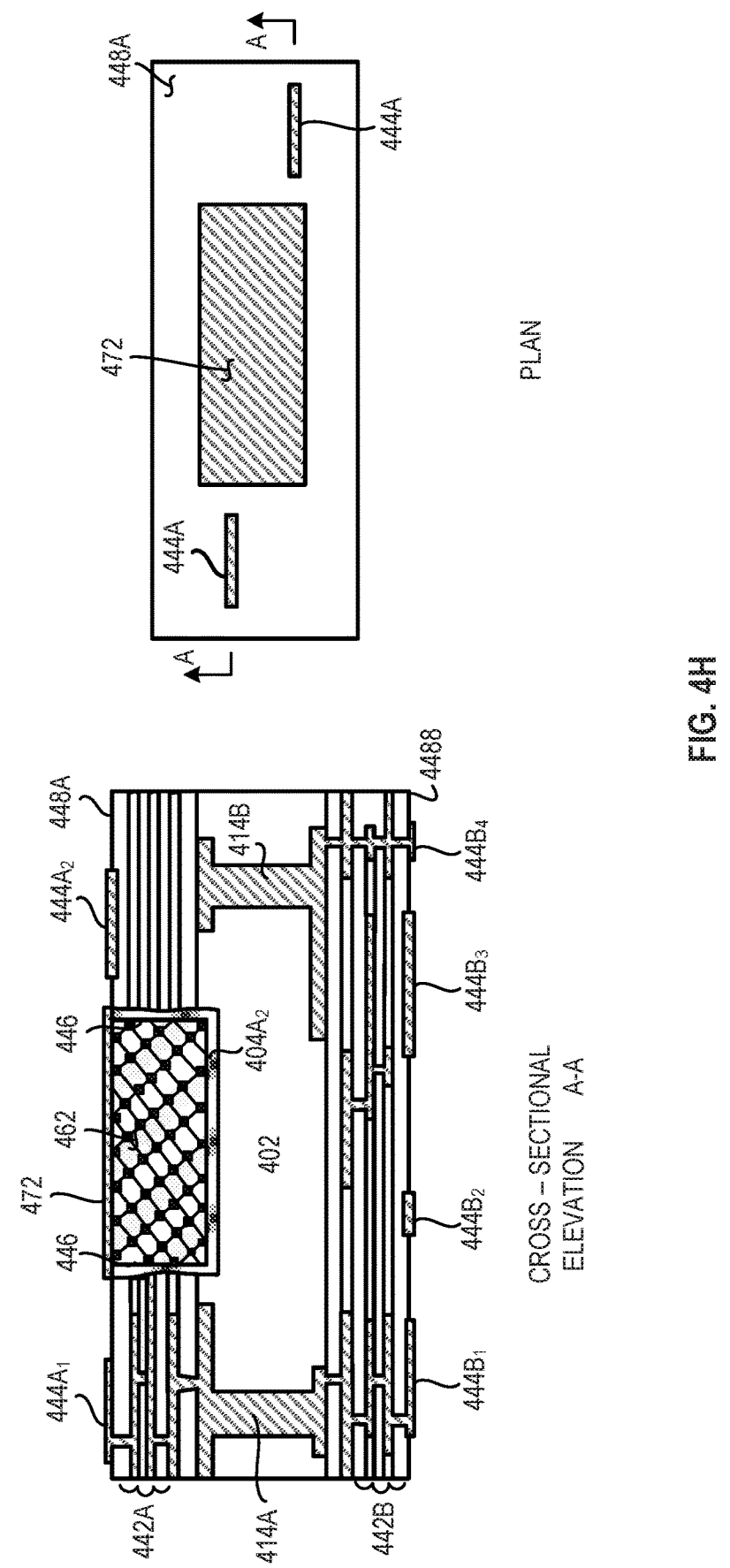

SUBSTRATE DIELECTRIC WAVEGUIDES IN SEMICONDUCTOR PACKAGES

CROSS-REFERENCE TO RELATED APPLICATIONS

This patent application is a U.S. National Phase Application under 35 U.S.C. § 371 of International Application No. PCT/US2016/069376, filed on Dec. 30, 2016, the entire contents of which is hereby incorporated by reference herein.

TECHNICAL FIELD

The present disclosure relates to systems and methods for forming dielectric waveguides in semiconductor substrates.

BACKGROUND

With the increasing functionality of complementary metal oxide semiconductor (CMOS) circuitry and the increasing density of semiconductor devices, it becomes increasingly difficult to physically position a sufficient number of interconnects on the exterior surface of a die. Generally, such limitations are addressed by adding more bumps to the die by increasing the physical size of the die or by reducing the physical pitch of the bumps or by increasing the data rate across an interconnect. Practical considerations, such as routing and die assembly, tend to limit the number of bumps physically coupleable to a die. Furthermore, signal integrity tends to limit the maximum reliable data transfer rate across an individual bump.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 4H includes plan and cross-sectional elevation views of the patterned conductive clad core depicted in FIG. 4G after a conductive layer is patterned, deposited, or otherwise formed over the dielectric material added in FIG. 4G, in accordance with at least one embodiment described herein;

Figure 1:
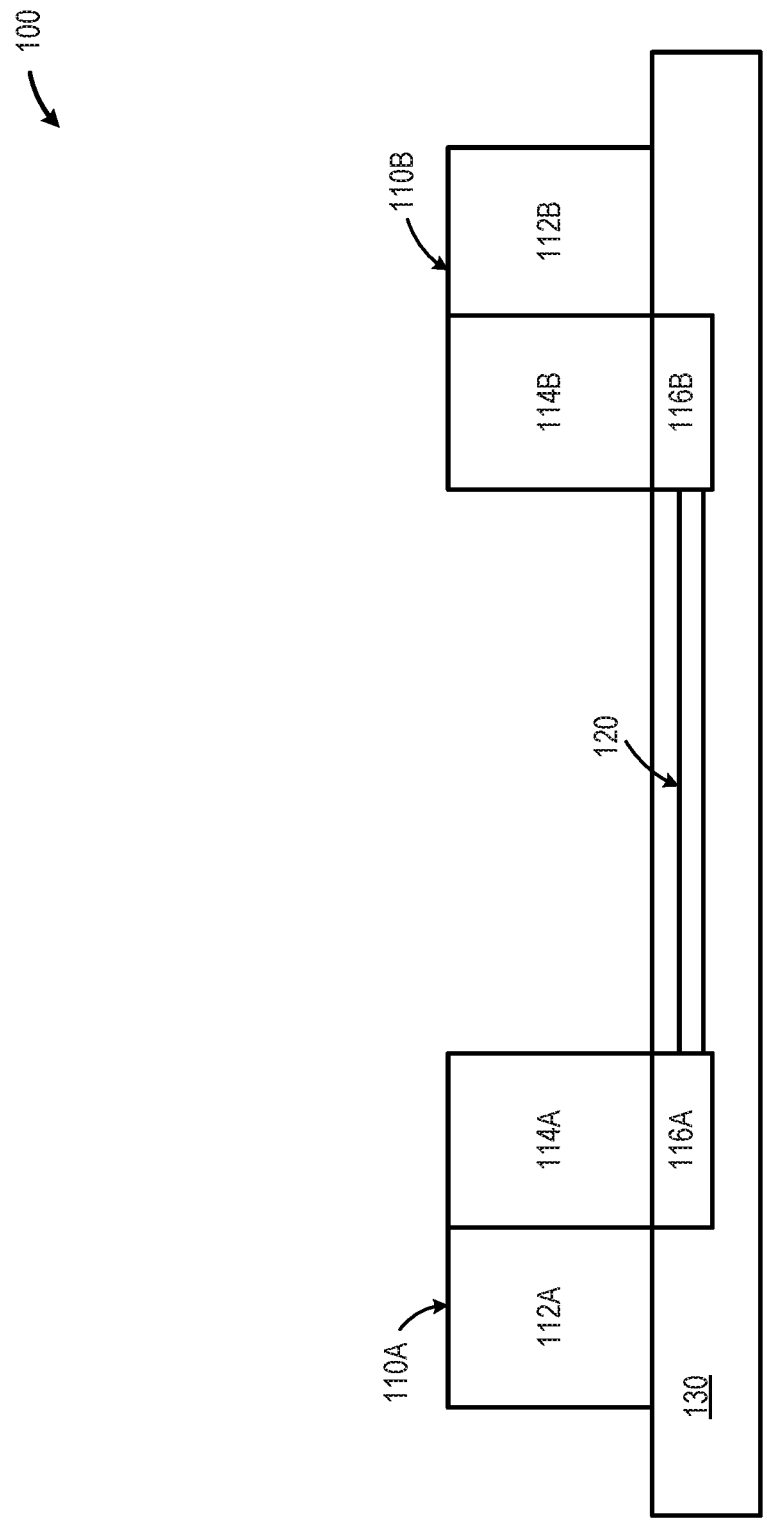
FIG. 1 is a schematic of an illustrative semiconductor package having one or more dielectric waveguides formed in the semiconductor package substrate to facilitate radio frequency (RF) communication between a plurality of semiconductor dies, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

As the functionality of complementary metal oxide semiconductor (CMOS) circuitry and the size of individual transistors scales ever downward, it has become increasingly difficult to provide a sufficient number of interconnects out of a die. One solution has been to increase the number of contacts or bumps on the die either by increasing the size of the die to accommodate the increased number of bumps and/or by decreasing the size of the bumps while increasing the bump pitch. Practical manufacturing tolerances, such as assembly and/or routing within the die, tend to limit the number of bumps possible for any given die. Further, practical data rate limits exist for any given interconnect, or sets of interconnects in the case of differential signaling.

A solution is to modulate a higher frequency signal and transmit the modulated, high frequency, signal between dies within a semiconductor package. Using this architecture, multiple frequencies may be transmitted simultaneously using a single channel and higher order modulation schemes may be implemented to increase the data transfer rate. However, if such signals are transmitted over a traditional transmission line (e.g., co-planar waveguide, stripline, or microstrip), the transmission can be quite lossy and the traditional signal integrity issues of noise and cross-talk are still present.

An improved solution is to implement waveguides to transfer signals between semiconductor dies disposed in the semiconductor package. Such waveguides may include, for example, waveguides specifically tuned to optimize transmission parameters within designated millimeter wave (mm-wave) bands, such as from about 30 GHz to about 300 GHz. The use of waveguides at higher frequencies, such as mm-wave frequencies, beneficially provides for reliable transmission of modulated high data rate signals with lower losses and less cross-talk than traditional electrical interconnects, such as traces or similar conductive structures. This also provides a potential solution for bump-limited dies (by advantageously providing for higher data transfer rates per bump) as well as beneficially providing improved signal integrity even at higher data transfer rates. Such waveguides may be built directly into semiconductor package layers or may be incorporated into one or more interposed layers that are physically and communicably coupled between the semiconductor dies and the semiconductor package. Transmission of mm-wave signals through substrate waveguides permits the transmission of multiple signals along a single waveguide. Such mm-wave signals may have differing polarizations and/or may be transmitted at different frequencies, thereby increasing the bandwidth on a single waveguide. Substrate integrated waveguides (SIWs) are well known, but depend on using vias to form the waveguide walls and the dielectric material of the substrate is used as the dielectric material of the waveguide. By using a "continuous via" or "trench via" (which can be fabricated in a number of ways), field confinement can be increased and the waveguides become practical for higher frequencies. By etching the substrate material and filling the etched volume with a second dielectric material, the waveguide size can be decreased, the size of the waveguide can be dramatically reduced, or other electrical or mechanical optimizations can be made.

A system for transmission of mm-wave signals between semiconductor dies is provided. The system may include a first semiconductor die that includes a first RF-transceiver capable of communicating on at least a first mm-wave frequency; a second semiconductor die that includes a second RF-transceiver capable of contemporaneously communicating on at least the first mm-wave frequency; and a dielectric member having at least one waveguide formed therein, where the waveguide communicably couples the first RF transceiver with the second RF transceiver; the waveguide a pathway for bidirectional communication between the first semiconductor die and the second semiconductor die at the first frequency; and the first semiconductor die and the second semiconductor die are physically coupled to the dielectric member at a location proximate the dielectric waveguide.

A method of communicating a mm-wave signal between a first component and a second component disposed on a common semiconductor package is provided. The method may include generating at least a first mm-wave signal by a first component operably and communicably coupled to a dielectric member; launching at least the first mm-wave signal into a waveguide formed in the dielectric member; and receiving the first mm-wave signal at a second component operably and communicably coupled to the dielectric member.

A semiconductor package is provided. The semiconductor package may include: a dielectric member having at least one waveguide formed therein, the waveguide including a first end and a second end; a first component that includes a first radio frequency (RF) transceiver, the first component operably and communicably coupled to the dielectric member, the first RF transceiver communicably coupled at the first end of the at least one waveguide; and a second component that includes a second RF transceiver, the second component operably and communicably coupled to the dielectric member, the second RF transceiver communicably coupled at the second end of the at least one waveguide.

A system for wirelessly communicating between a first component and a second component disposed on a common semiconductor package is provided. The system may include: a means for generating at least a first RF-signal using a first component operably and communicably coupled to a dielectric member; a means for launching at least the first RF-signal into a waveguide formed in the dielectric member; and a means for receiving the RF-signal using a second component operably and communicably coupled to the dielectric member.

As used herein the term "radio frequency" and the abbreviation "RF" refer to any or all of the frequencies that fall within the portion of the electromagnetic frequency spectrum that extends from about 500 kHz to about 300 GHz. The terms "millimeter-wave" and "mm-wave" refer to any or all or the frequencies that fall within the portion of the electromagnetic frequency spectrum that extends from about 30 GHz to about 300 GHz.

FIG. 1 provides an illustrative semiconductor package 100 having one or more waveguides 120A-120n (collectively, "waveguides 120") formed in the semiconductor package substrate 130 to facilitate radio frequency (RF) communication between a plurality of semiconductor dies 110A, 110B (collectively, "semiconductor dies 110"), in accordance with at least one embodiment described herein. As depicted in FIG. 1, a number of waveguides 120 may be formed in the semiconductor package substrate 130. The waveguides 120 may communicably couple a first semiconductor die 110A with a second semiconductor die 110B, thereby enabling bidirectional communication of information and/or data between semiconductor dies 110 using an RF signal, such as a mm-wave signal having a frequency of from about 30 GHz to about 300 GHz. Each of the semiconductor dies 110A, 110B may include one or more logic circuits 112A, 112B (collectively "logic circuits 112"), one or more transceivers 114A, 114B (collectively, "RF transceivers 114"), and one or more RF launchers 116A, 116B (collectively "RF-launchers 116"). In some implementations, some or all of the logic circuit 112, the RF transceiver 114, and/or the RF launcher 116 may be disposed in, on, or about a single semiconductor die. In some implementations, some or all of the logic circuit 122, the RF transceiver 114, and/or the RF launcher 116 may be disposed in, on, or about a plurality of semiconductor dies.

In a transmit mode, the logic circuit 112 generates a signal containing information and/or data. The RF transceiver 114 receives the signal from the logic circuit 112 and modulates the signal onto a high-frequency carrier signal. The RF-launcher 116 receives the high-frequency modulated carrier wave from the RF-transceiver 114 and launches the high-frequency carrier signal containing the information and/or data into a communicably coupled waveguide 120.

In a reception or receive mode, the RF-launcher 116 receives a high frequency carrier signal containing information and/or data from the communicably coupled waveguide 120. The RF-launcher 116 forwards the high-frequency carrier signal containing the information and/or data to the RF-transceiver 114. The RF-transceiver 114 demodulates the information and/or data from the carrier signal and forwards the signal containing the information and/or data to the logic circuit 112.

In some implementations, a plurality of semiconductor dies 110 disposed in a common semiconductor package 100 may communicate or otherwise exchange information and/or data using RF signals generated by the RF-transceiver 114 and launched into a waveguide 120 formed in the substrate 130 of the semiconductor package 100. Although any RF frequency may be used to provide such communication, mm-wave RF frequencies falling in a range of the electromagnetic spectrum extending from about 30 GHz to about 300 GHz may be used to communicate information and/or data between semiconductor dies 110.

In some implementations, some or all of the logic circuit 112 and the RF-transceiver 114 may be formed or otherwise disposed within a common semiconductor die 110. In some implementations one or more electrically conductive members, traces, vias, or combinations thereof may communicably couple the semiconductor die 110 to one or more RF-launchers 116 disposed proximate an end of the waveguide 120.

The logic circuit 112 may include any number and/or combination of systems and/or devices capable of transmitting, receiving, and/or communicating one or more signals that include information and/or data. Example logic circuits 112 may include, but are not limited to, one or more: controllers, processors, microprocessors, digital signal processors (DSPs), central processing units (CPUs), graphical processing units (GPUs), application specific integrated circuits (ASICs), reduced instruction set computers (RISCs), serializer-deserializer (SERDES) circuits, or combinations thereof. In some implementations, the logic circuit 112 may include one or more communications interfaces at or through which the information and/or data flow to and/or from the logic circuit 112 occurs. In some implementations, the logic circuit 112 may include one or more internal communications interfaces through which communication with the RF-transceiver 114 occurs. In other implementations, the logic circuit 112 may include a communications interface communicably coupled to one or more bumps or similar contacts on an external surface of the semiconductor die 110 and through which communication with the RF-transceiver 114 occurs.

In some implementations, the logic circuit 112 may receive all or a portion of the information and/or data from one or more other devices communicably coupled to the semiconductor package 100 and may forward all or a portion of the information and/or data to the RF-transceiver 114. In such implementations, the logic circuit 112 may perform one or more actions on the received information and/or data prior to forwarding the received information and/or data to the RF-transceiver 114. For example, the logic circuit 112 may filter or otherwise improve the signal-to-noise ratio of the signal containing the information and/or data or employ data correction techniques.

The RF-transceiver 114 may include any number and/or combination of systems and/or devices capable of receiving information and/or data from one or more communicably coupled logic units 112. In addition, or alternatively, the RF-transceiver 114 may include any number and/or combination of systems and/or device capable of transmitting or otherwise passing information to one or more logic communicably coupled logic circuits 112. In some implementations, the RF-transceiver 114 modulates the information and/or data received from a communicably coupled logic device 112 onto an RF signal, such as a mm-wave signal. In some implementations, the RF-transceiver 114 demodulates the information and/or data received from a communicably coupled RF-launcher 116 prior to communicating the demodulated information and/or data to one or more communicably coupled logic devices 112.

The RF-launcher 116 may include any number and/or combination of devices and/or systems capable of receiving the high frequency RF signal from the RF-transceiver 114 and launching the high frequency signal into a communicably coupled waveguide 120. In some implementations, all or a portion of the RF-launcher 116 may be disposed proximate and communicably coupled to the RF-transceiver 114. In some implementations, all or a portion of the RF-launcher 116 may be disposed remote from and communicably coupled to the RF-transceiver 114. In such implementations, the RF-launcher 116 may be communicably coupled to the RF-transceiver 114 via one or more conductive members, such as one or more: traces, vias, or combinations thereof. In such implementations, all or a portion of the RF-launcher 116 may be formed at least partially inside or internal to the waveguide 120. For example, the RF-launcher may be etched, photolithographically formed, or otherwise deposited at least partially within an internal space formed by the waveguide 120. In some implementations, the RF-launcher 116 may be formed using vias, edge plating, or similar structures, deposition technologies, or combinations thereof in a location within the dielectric member 130 proximate all or a portion of the waveguide 120.

The RF-launcher 116 may be fabricated based, at least in part, on the operating frequency of the RF-transceiver 114 and/or the waveguide 120. For example, the RF-launcher 116 may include an angled-slot type launcher formed or otherwise disposed within an interior portion of the waveguide 120. In another implementation, the RF-launcher 116 may include one or more structures formed by a plurality of vias, a plurality of metallic layers, or combinations thereof. In such an implementation, the RF-launcher 116 may include one or more horn-type or similar structures used to focus and/or launch the high-frequency RF signal into the waveguide 120 and/or to receive the high-frequency RF signal from the waveguide 120. In some implementations, the RF-launcher 116 may include one or more structures to reduce energy losses in the high-frequency RF signal when transitioning from the RF-launcher 116 to the waveguide 120. In some implementations, the RF-launcher 116 may be formed in, on, or about the RF-transceiver 114 in a location proximate the waveguide 120. Such energy loss minimizing structures may include, but are not limited to one or more vias disposed in a geometric pattern about a terminal end of the waveguide 120, one or more conductive layers and/or edges disposed in a pattern about a terminal end of the waveguide 120, or combinations thereof. In some implementations, the RF-launcher 116 may include one or more microstrip to waveguide transitions or stripline to waveguide transitions. In some implementations, the RF-launcher 116 may include a tapered or angled blade type launcher disposed at least partially within the waveguide 120. In some implementations, the RF-launcher 116 may include one or more vias or similar structures operably and communicably coupled directly or indirectly to the RF-transceiver 114 and disposed within a portion of the waveguide member 120.

The waveguide 120 may include any number and/or combination of systems and/or devices capable of transmitting one or more electromagnetic signals (e.g., one or more high-frequency RF signals or one or more mm-wave signals) between semiconductor dies 110. The waveguide 120 may be disposed in whole or in part within a dielectric member 130 forming at least a portion of the semiconductor package 100. In some implementations, the semiconductor dies 110 may be operably and communicably coupled to the dielectric member 130 thereby providing a communications pathway between the logic circuit 112 and the waveguide 120. The waveguide 120 may include a partially or completely enclosed (i.e., be surrounded by a partial or complete) electrically conductive wall structure to form a closed shape having a similar or different cross-sectional profile along all or a portion of the waveguide 120. In some implementations, the waveguide 120 may include one or more materials having a dielectric constant greater than the surrounding dielectric member 130.

In some implementations, the waveguide 120 may include an electrically conductive wall formed in the dielectric material 130 using any current deposition or application technology. In some implementations, all or a portion of the electrically conductive walls of the waveguide 120 may be formed via photolithography, plating, electro-less plating, or similar techniques. In some implementations, all or a portion of the electrically conductive walls of the waveguide 120 may be formed via lamination or similar deposition techniques. In some implementations, all or a portion of the hollow interior of the waveguide 120 may be formed via etching, mechanical abrasion, laser ablation, or similar material removal techniques. In some implementations, the waveguide 120 may include one or more planar members or one or more planar member arrays.

In embodiments, the waveguide 120 may be hollow, unfilled, or filled with a gas such as air. In other embodiments, the waveguide 120 may be at least partially filled with one or more dielectric materials. In some implementations, the dielectric constant of the material(s) at least partially filling the waveguide 120 may exceed the dielectric constant of the surrounding dielectric material 130. In some implementations, the dielectric constant of the material(s) at least partially filling the waveguide 120 may exceed the dielectric constant of the semiconductor package substrate.

The waveguide 120 may have any size, shape, or cross-sectional geometry. For example, the waveguide 120 may have a square, rectangular, polygonal, oval, or circular cross-sectional geometry. The size of the waveguide is determined, at least in part, by the design operating frequency of the RF transceivers. For example, where a mm-wave transceiver 116 operating at a frequency of from about 150 GHz to about 225 GHz is used, a hollow, rectangular, waveguide may have cross-sectional dimensions of 1.25 millimeters (mm) by 0.625 mm. In another example, where a mm-wave transceiver 116 operating at a frequency of from about 150 GHz to about 225 GHz is used, a dielectric filled (dielectric constant =3), rectangular, waveguide 120 may have cross-sectional dimensions of 0.72 mm by 0.36 mm.

The dielectric member 130 may include any number and/or combination of structures, members or similar components capable of physically supporting the semiconductor dies 110. In some implementations, the dielectric member may include all or a portion of a substrate member that forms all or a portion of the semiconductor package 100. The dielectric member 130 may include one or more printed circuit boards or one or more laminated printed circuit boards. The dielectric member 130 may include conductive structures deposited, photolithographed, or otherwise patterned onto the dielectric member 130, such conductive structures may take the form of various layers within the dielectric member 130. One or more dielectric materials form the dielectric member 130, each of the one or more dielectric materials may have the same or a different dielectric constant. In some implementations, the dielectric material disposed inside the waveguide 120 may have a dielectric constant greater than the dielectric constant of the one or more dielectric materials forming the dielectric member 130.

Figure 2:
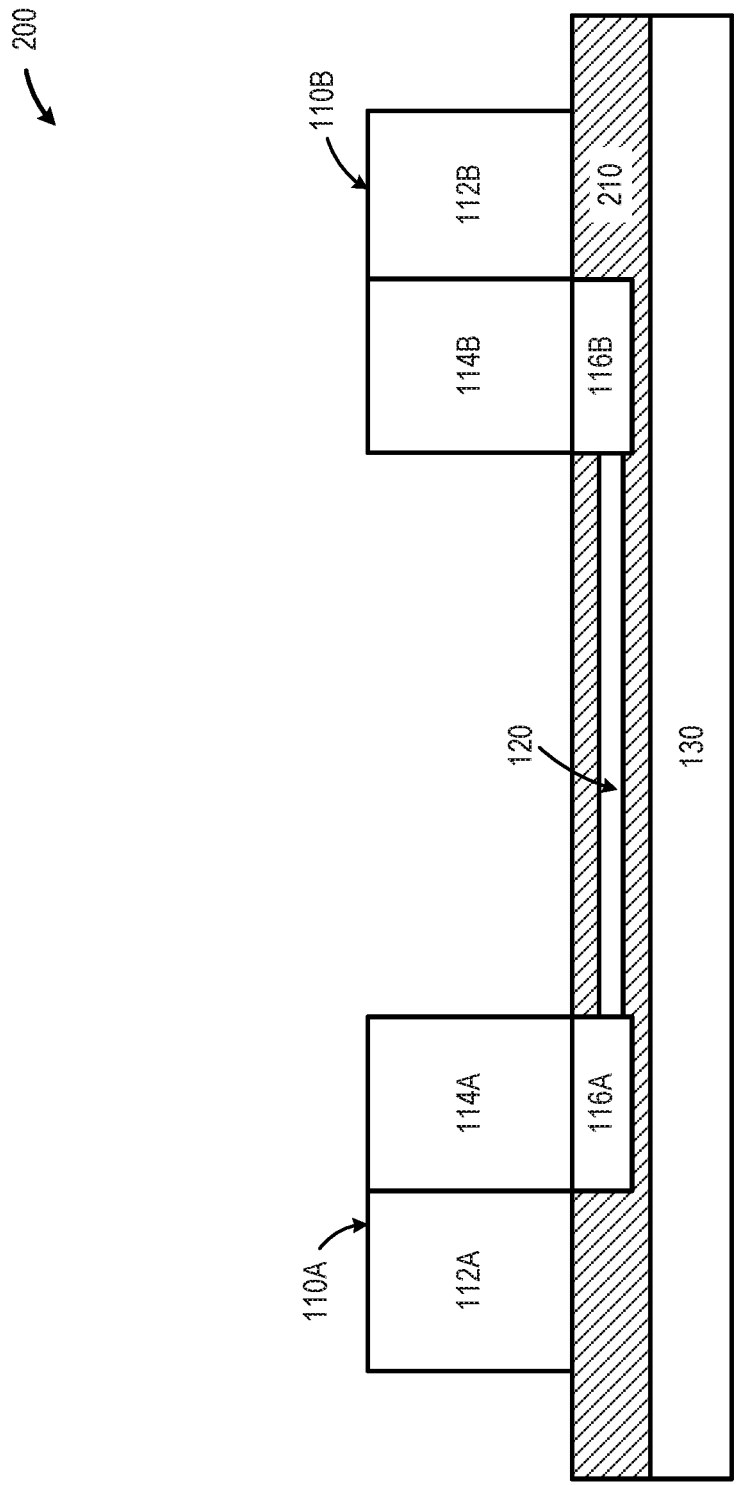
FIG. 2 is a schematic of another illustrative semiconductor package having one or more dielectric waveguides formed in an interposer layer 210 that is physically and conductively coupled to the semiconductor package substrate to facilitate radio frequency (RF) communication between a plurality of semiconductor dies physically and operably coupled to the interposer layer, in accordance with at least one embodiment described herein.

FIG. 2 depicts an illustrative semiconductor package 200 having one or more waveguides waveguide 120 formed in an interposer layer 210 that is physically and conductively coupled to the semiconductor package substrate 130 to facilitate radio frequency (RF) communication between a plurality of semiconductor dies 110A, 110B (collectively, "semiconductor dies 110") physically and operably coupled to the interposer layer 210, in accordance with at least one embodiment described herein. The use of an interposer layer 210 beneficially permits the fabrication of the waveguide external to the dielectric member 130. Where a semiconductor package 200 provides all or a portion of the dielectric member 130, such fabrication advantageously reduces the cost of rework attributable to the mis-manufacture of the waveguide 120 since only the interposer layer 210 and not the entire semiconductor package 200 is lost. Additionally, the interposer layer 210 may be fabricated from materials selected for workability and/or physical/mechanical properties suitable for fabrication of the waveguide 120 but otherwise unsuitable for use as a substrate material for the semiconductor package 200.

As depicted in FIG. 2, the interposer layer 210 may be deposited on an upper surface of the dielectric member 130, however the interposer layer 210 is not limited to deposition on the upper surface of the dielectric member 130. It should be understood that one or more interposer layers 210 may be formed or otherwise disposed at one or more intermediate layers or points within the dielectric member 130.

The interposer layer 210 is disposed proximate and at least partially covers the substrate member 130. All or a portion of the logic circuits 112 and/or the RF-transceivers 114 may be physically and communicably coupled to the interposer layer 210. As depicted in FIG. 2, the waveguide 120 may be formed in whole or in part within the interposer layer 210. In some embodiments, no portion of the waveguide 120 extends into the substrate member 130. The interposer layer 210 is physically and communicably coupled to the dielectric member 130. Where the dielectric layer 130 includes all or a portion of the semiconductor package substrate, the interposer layer 210 may be physically and communicably coupled to the dielectric member 130. The interposer layer 210 may include any number of plies, laminates, or layers some or all of which may contain any number of conductive traces, vias, or similar structures. In some implementations, the interposer layer 210 may include a number of vias or similar through-layer, electrically conductive structures to electrically conductively couple the semiconductor dies 110 to conductive structures within the dielectric member 130.

The interposer layer 210 may include any number or combination of materials. The electromagnetic properties of the material selected to form the interposer layer 210 may beneficially further reduce the physical size of the waveguide 120. For example, a silicon interposer layer 210 may reduce the physical dimensions of a dielectric filled (dielectric constant of silicon ~11) waveguide frequency operating at a frequency of about 150 GHz to about 225 GHz to 0.4 mm by 0.2 mm. Other interposer layer materials may include, but are not limited to: borosilicate glass, ceramic, or an interposer layer 210 that includes a plurality of materials either combined or layered to provide a composite interposer layer 210. Beneficially, material having a very high dielectric constant, but which are unsuitable for fabrication of the dielectric member 130 may be selected to further reduce the dimensions of the waveguide.

Figure 3A:
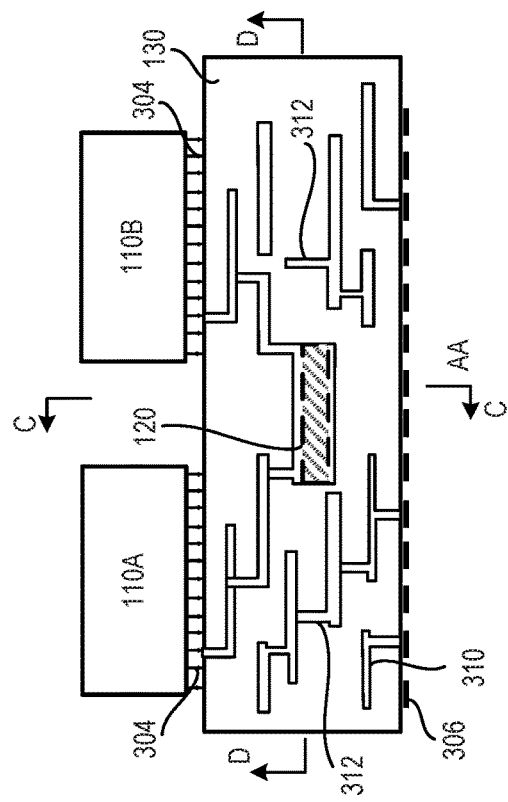
FIG. 3A is a plan view of an illustrative semiconductor package that includes a first semiconductor die and a second semiconductor die communicably coupled via a plurality of dielectric waveguides routed through the semiconductor package substrate, in accordance with at least one embodiment described herein.
Figure 3B:
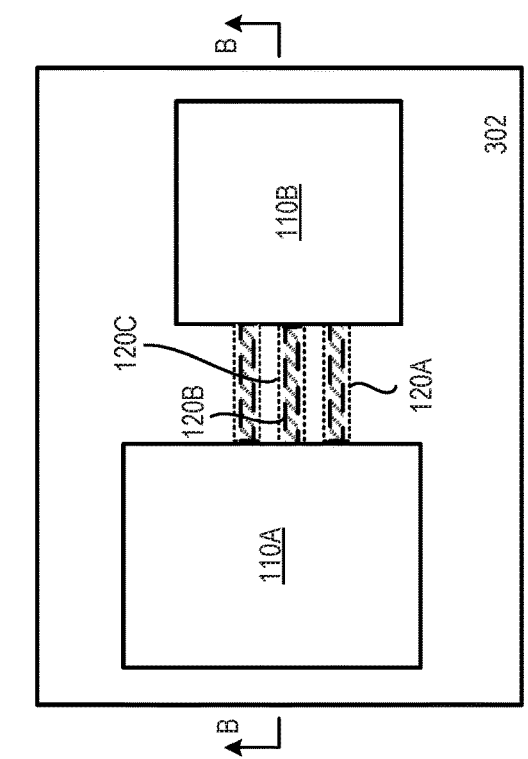
FIG. 3B is a cross-sectional elevation of the semiconductor package depicted in FIG. 3A along sectional line B-B, in accordance with at least one embodiment described herein.
Figure 3C:
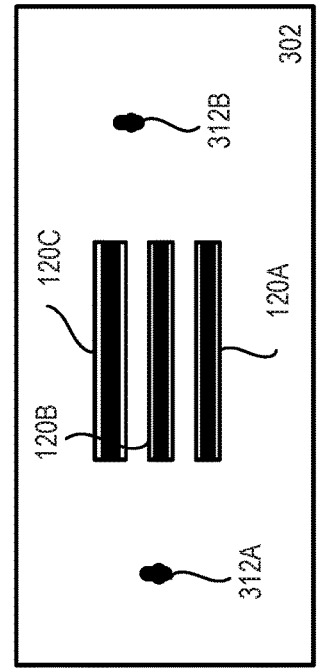
FIG. 3C is a cross-sectional elevation of the semiconductor package 300 depicted in FIG. 3B along sectional line C-C, in accordance with at least one embodiment described herein.
Figure 3D:
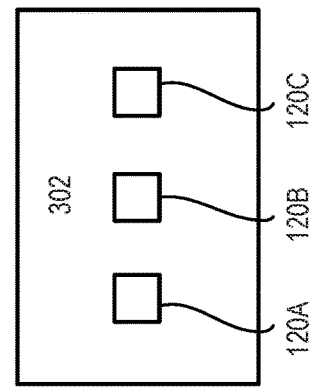
FIG. 3D is a cross-sectional elevation of the semiconductor package 300 depicted in FIG. 3B along sectional line D-D, in accordance with at least one embodiment described herein.

FIG. 3A depicts a plan view and FIGS. 3B, 3C, and 3D depict various cross-sectional elevation views of an illustrative semiconductor package 300 that includes a first semiconductor die 110A and a second semiconductor die 110A communicably coupled via a plurality of waveguides 120A-120n routed through the semiconductor package substrate 302, in accordance with at least one embodiment described herein. Turning first to FIG. 3A, three waveguides 120A-120C communicably couple the first semiconductor die 110A with the second semiconductor die 110B. The three waveguides 120 may operate at the same or different frequencies. In some implementations, the three waveguides 120 may operate at the same or different frequencies within the mm-wave frequency band. Each of the three waveguides 120 may be hollow or dielectric filled. Each of the three waveguides 120 may have the same or different dimensions, physical configuration, and/or cross-sectional geometry. For example, if each of the waveguides 120A-120C are operated at different frequencies, each of the waveguides 120A-120C may have a different cross-sectional geometry that minimizes dispersion at the operating frequency of the respective waveguide 120.

FIG. 3B depicts a cross-sectional elevation of the semiconductor package 300 along sectional line B-B depicted in FIG. 3A, in accordance with at least one embodiment described herein. Visible in FIG. 3B are the conductive couplings 304 that physically and communicably couple the first semiconductor dies 110A and 110B to the semiconductor package substrate 302. Also visible in FIG. 3B are the conductive couplings 306 that physically and communicably couple the semiconductor package 300 to a structure such as a rack mounted server or rack mounted storage device. Various conductive traces 310 and vias 312 within the semiconductor package substrate 130 communicably couple the semiconductor dies 110 to each other and to one or more external components, interfaces, buses, or similar. The waveguide 120 is routed through the semiconductor package substrate 302 and between the semiconductor dies 110.

In an illustrative operational embodiment, semiconductor die 110A may include a mm-wave die that modulates information and/or data onto a mm-wave signal. The mm-wave signal travels through a bump on semiconductor die 110A to a trace 310 in the semiconductor package substrate 302. The mm-wave signal is launched into waveguide 120 via an RF-launcher 116 (not visible in FIG. 3B) disposed in the semiconductor package substrate 302. The mm-wave signal travels along the waveguide 120 to semiconductor die 110B where the process is reversed and the original information and/or data demodulated from the received mm-wave signal.

FIG. 3C depicts a cross-sectional elevation of the semiconductor package 300 along sectional line C-C shown in FIG. 3B, in accordance with at least one embodiment described herein. Visible in FIG. 3C are the three waveguides 120A-120C. Each of the waveguides 120 is filled with a dielectric material. In some implementations, the dielectric material that fills the waveguide 120 may include a material having a higher or greater dielectric constant than the surrounding semiconductor package substrate 302. Although all three waveguides 120 are depicted as having the same physical dimensions, in some implementations, the three waveguides may have different cross-sectional geometries and/or cross-sectional dimensions.

FIG. 3D depicts a cross-sectional plan of the semiconductor package 300 along sectional line D-D shown in FIG. 3B. Visible in FIG. 3D are the three waveguides 120A-120C that communicably couple semiconductor die 110A to semiconductor die 110B. Also visible in FIG. 3D are vias 312A and 312B that connect traces within the semiconductor package substrate 302.

Figure 4A:
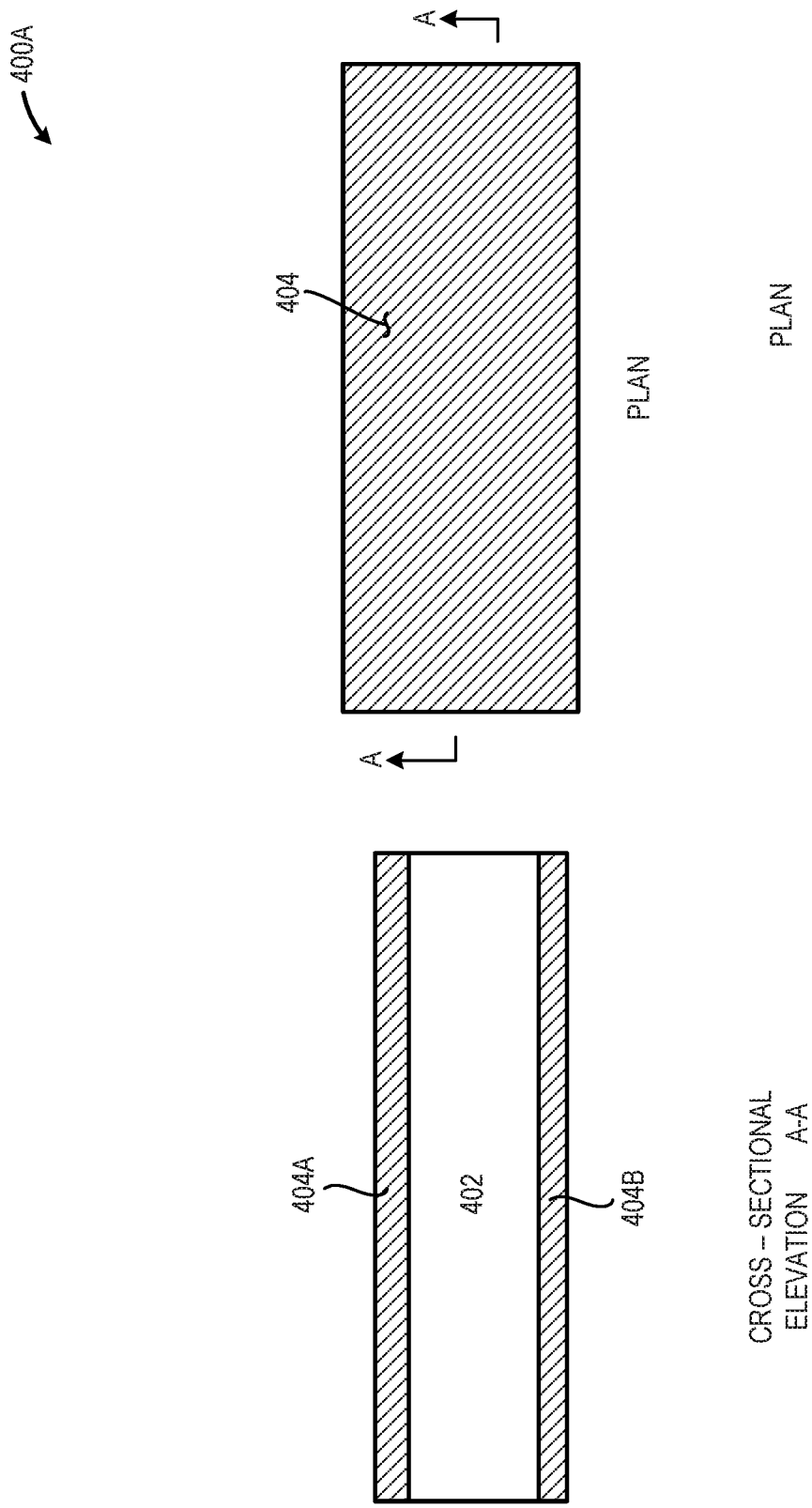
FIG. 4A includes plan and cross-sectional elevation views of an illustrative method of forming a dielectric waveguide in a dielectric member or semiconductor package substrate, in accordance with at least one embodiment described herein.

FIGS. 4A through 4H depict an illustrative method 400 of forming a waveguide 120 in a dielectric member 130 or semiconductor package substrate 302, in accordance with at least one embodiment described herein. Turning first to FIG. 4A, an incoming clad core material 400A is depicted. The clad core material includes a dielectric core with conductive material (e.g., copper) bonded to all or a portion of the upper and lower surfaces. The conductive material clad core includes a dielectric material 402 having an upper conductive layer 404A and a lower conductive layer 404B disposed proximate opposite sides of the dielectric material 402.

Figure 4B:
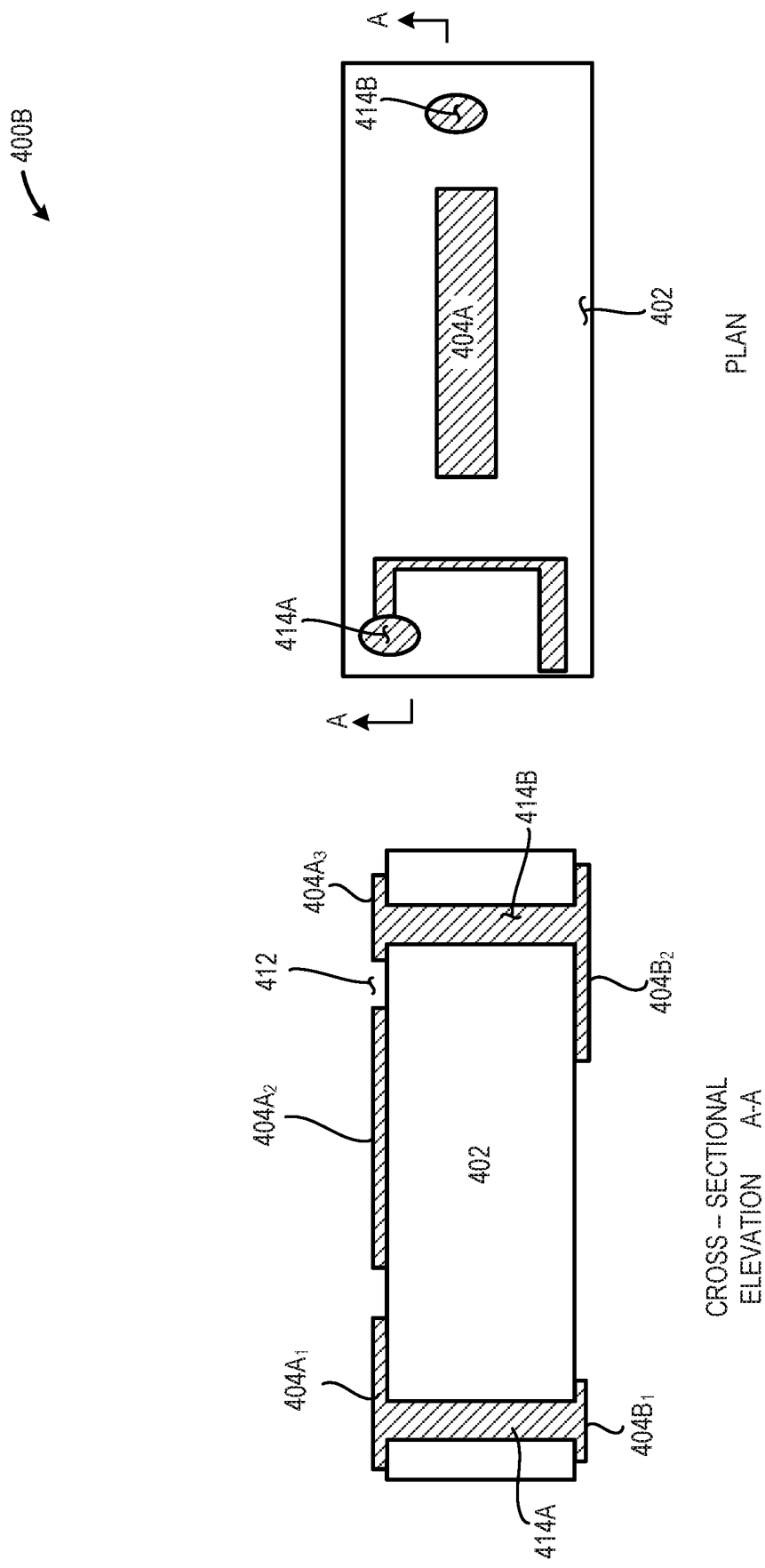
FIG. 4B includes plan and cross-sectional elevation views of the conductive clad core depicted in FIG. 4A after patterning, drilling, etching, and plating, in accordance with at least one embodiment described herein.

FIG. 4B depicts the conductive clad core of FIG. 4A after patterning, drilling, etching, and plating. Visible in FIG. 4B are traces $404A_1$-$404A_3$ on the upper surface of the dielectric material 402 and traces $404B_1$-$4094B_2$ on the lower surface of the dielectric material 402. Vias 414A and 414B have been drilled and filled and conductively couple the traces 404A and 404B on the upper and lower surfaces of the dielectric material 402. Note trace $404A_2$ forms the lower surface of what will become a waveguide.

Figure 4C:
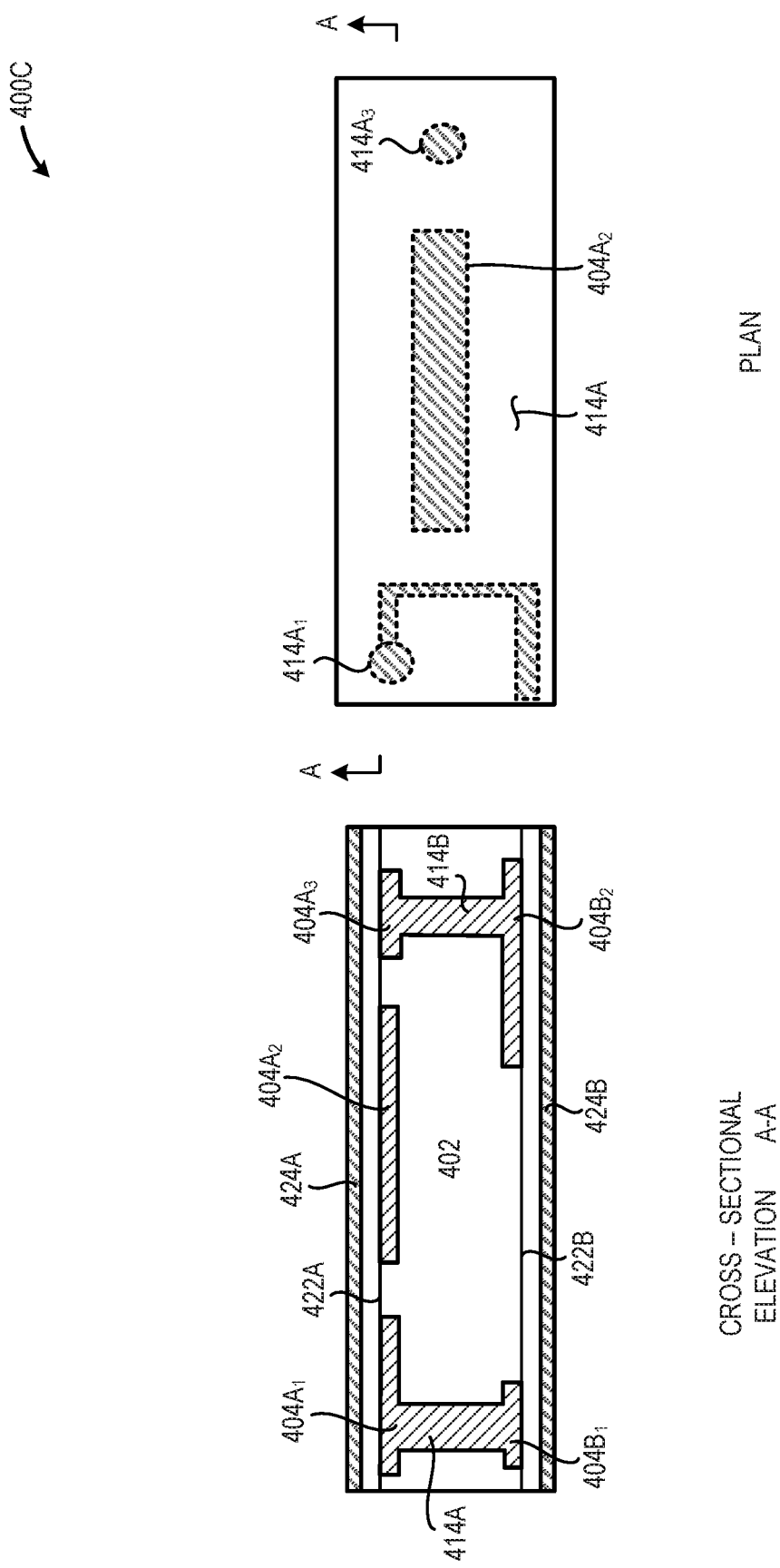
FIG. 4C includes plan and cross-sectional elevation views of the patterned conductive clad core depicted in FIG. 4B after the addition of an upper build-up dielectric layer and a lower build-up dielectric layer on the upper and lower surfaces of the patterned conductive clad core, respectively, in accordance with at least one embodiment described herein.

FIG. 4C depicts the patterned conductive clad core of FIG. 4B after the addition of an upper build-up dielectric layer 422A and a lower build-up dielectric layer 422B on the upper and lower surfaces of the patterned conductive clad core, respectively. An upper conductive layer 424A and a lower conductive layer 424B have been laminated to the upper build-up dielectric layer 422A and the lower build-up dielectric layer 422B, respectively.

Figure 4D:
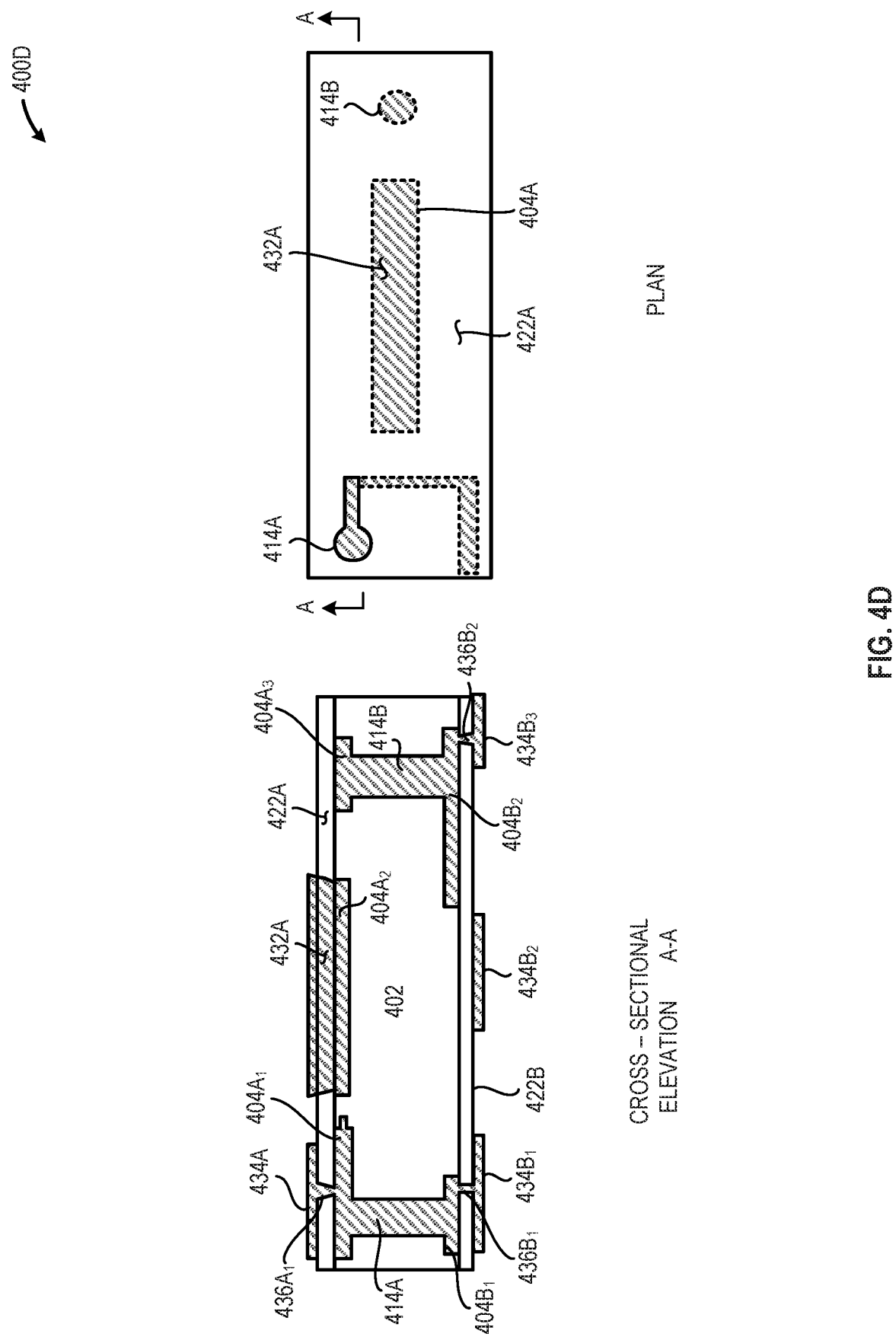
FIG. 4D includes plan and cross-sectional elevation views of the patterned conductive clad core depicted in FIG. 4C after drilling, filling, and patterning the build-up dielectric layers and conductive laminates or layers deposited, formed, or otherwise added in FIG. 4C, in accordance with at least one embodiment described herein.

FIG. 4D depicts the patterned conductive clad core 400 of FIG. 4C after drilling, filling, and patterning the build-up dielectric layers and conductive laminates or layers deposited, formed, or otherwise added in FIG. 4C. As depicted in FIG. 4D, a conductive laminate 424A has been patterned and etched to provide trace 434A on the upper surface of the patterned conductive core 400C. Also, conductive laminate 424B has been patterned and etched to provide traces $434B_1$-$434B_3$ on the lower surface of the patterned conductive core 400C.

The buildup dielectric layer 422A is patterned first to make via holes 436A and 436A1. The conductive layer is then deposited on the top of dielectric layer and patterned to provide traces 434A, 432A and metal filled via holes 436A and 436A1. The portion of the build-up dielectric layer 422A proximate trace $404A_2$ removed (via drilling, ablation, or a similar material removal process). Additionally, vias $436B_1$ and $436B_2$ were formed in the lower build-up dielectric layer 422B. Via 436A was filled with a conductive material and trace 434A patterned onto via 436A. An additional conductive layer 432A (which will eventually form a portion of the waveguide walls) is patterned onto trace $404A_2$. Similarly, vias $436B_1$ and $436B_2$ are filled with a conductive material and traces 434B1 and 434B3 patterned onto vias $436B_1$ and $436B_2$.

Figure 4E:
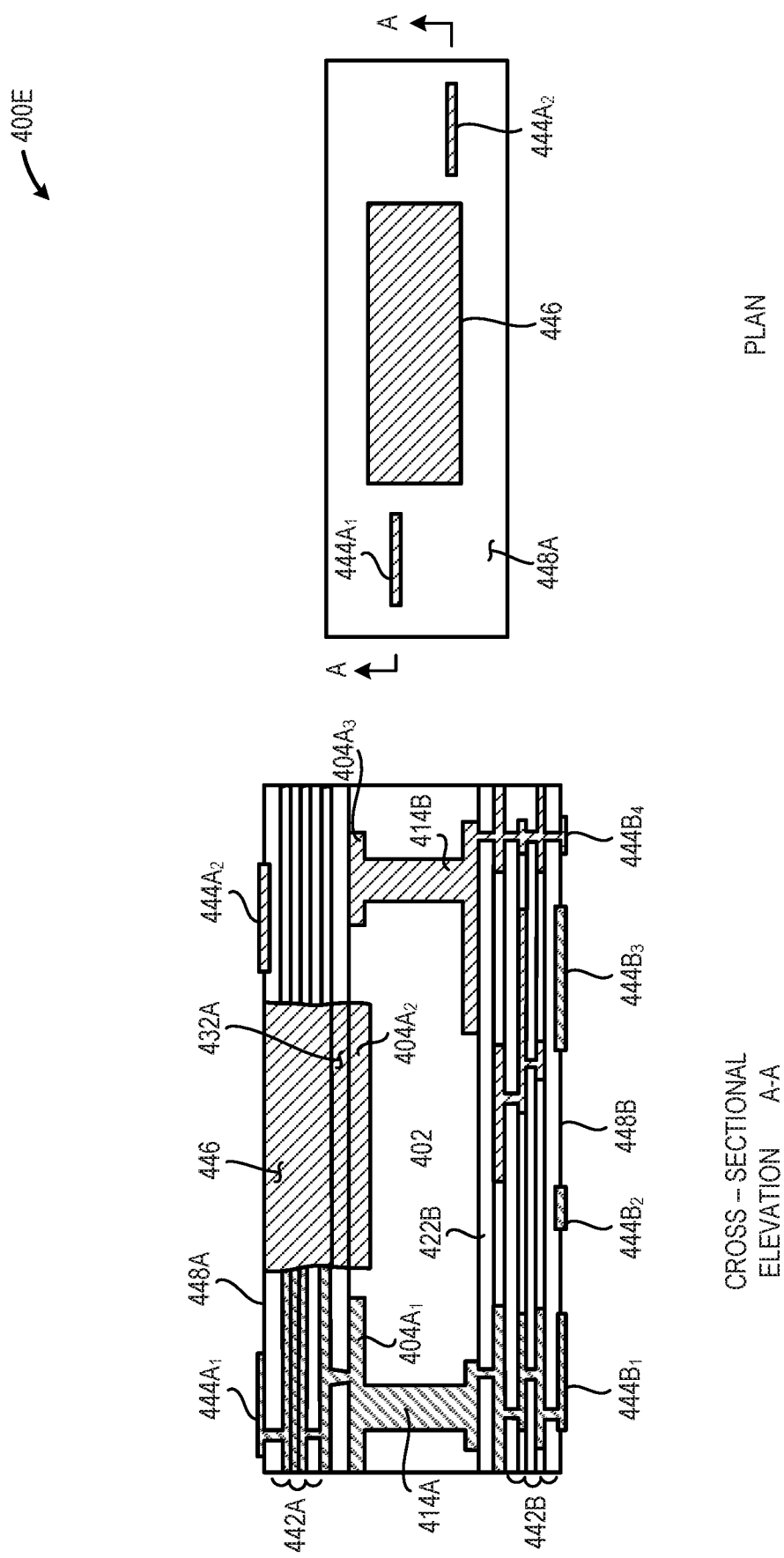
FIG. 4E includes plan and cross-sectional elevation views of the patterned conductive clad core depicted in FIG. 4D after drilling, filling, and patterning the build-up dielectric layers and conductive laminate layers deposited, formed, or otherwise added in FIG. 4D, in accordance with at least one embodiment described herein.

FIG. 4E depicts the patterned conductive clad core 400 of FIG. 4D after drilling, filling, and patterning the build-up dielectric layers and conductive laminate layers deposited, formed, or otherwise added in FIG. 4D. Although seven additional laminations are depicted in FIG. 4E, a greater or fewer number of laminations may be similarly applied. The various laminations may include any number and/or combination of upper build-up dielectric material layers and conductive layers 442A and lower build-up dielectric material layers and conductive layers 442B. Vias may be formed in some or all of the build-up dielectric layers and may be filled with a conductive material to provide through-layer conductive pathways within the semiconductor package substrate.

As depicted in FIG. 4E material proximate conductive layer 432A may be removed (via drilling, ablation, or a similar material removal process) and the resultant void space partially or completely filled with conductive material 446 that will eventually form all or a portion of the waveguide walls. As depicted in FIG. 4E conductive traces $444A_1$ and $444A_2$ are patterned, formed, or otherwise deposited on the upper surface of build-up dielectric layer 448A. Similarly, conductive traces $444B_1$-$444B_4$ are patterned, formed, or otherwise deposited on the lower surface of build-up dielectric layer 448B.

Figure 4F:
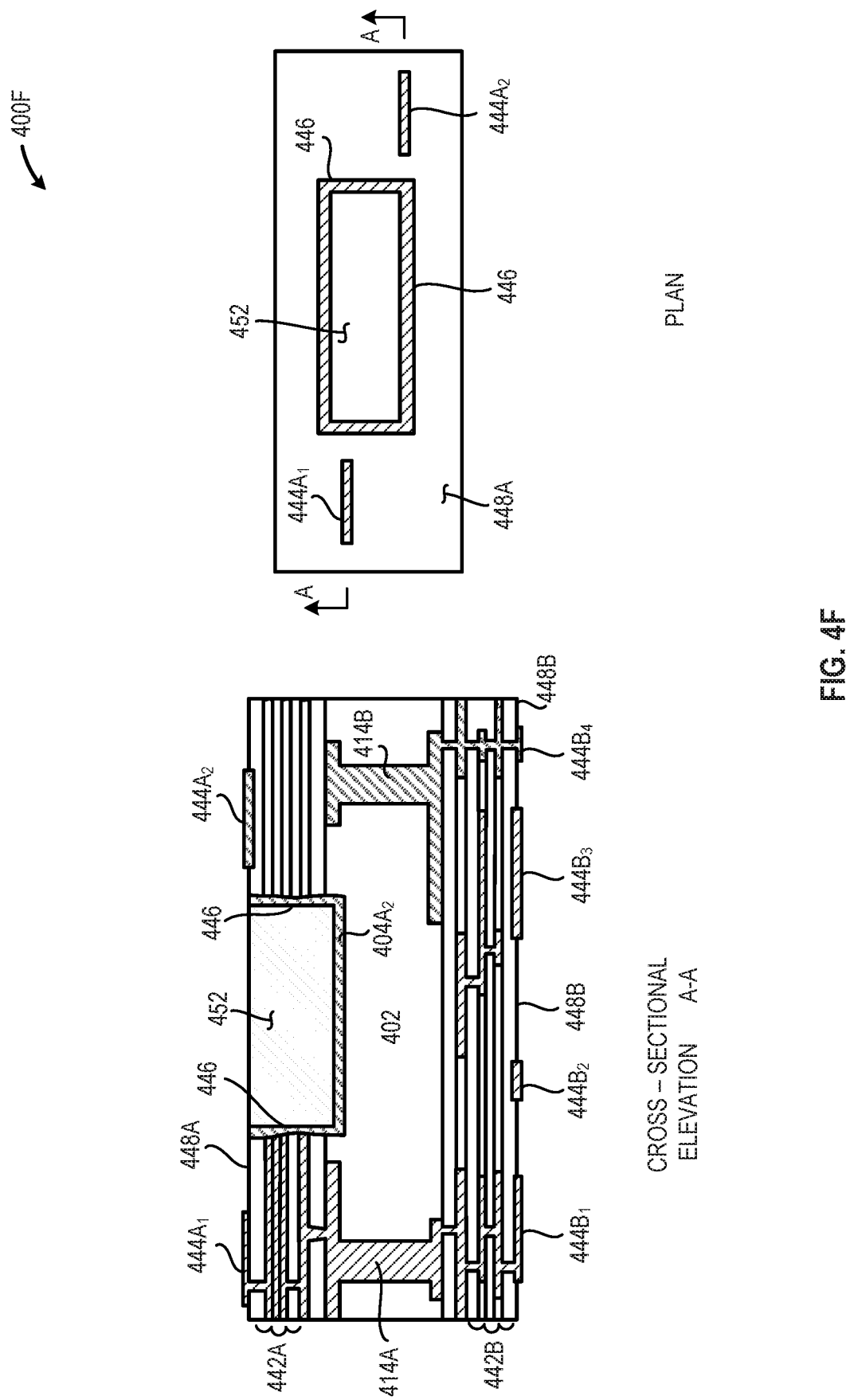
FIG. 4F includes plan and cross-sectional elevation views of the patterned conductive clad core depicted in FIG. 4E after selective removal of at least a portion of the conductive material added in FIG. 4E to form a void.

FIG. 4F depicts the patterned conductive clad core 400 of FIG. 4E after selective removal of at least a portion of the conductive material 446 added in FIG. 4E is removed to form a void 452 proximate conductive layer $404A_2$. The conductive material 446 may be selectively removed using any material removal technology, such as mechanical removal, etching, milling, drilling, ablation, or combinations thereof.

Figure 4G:
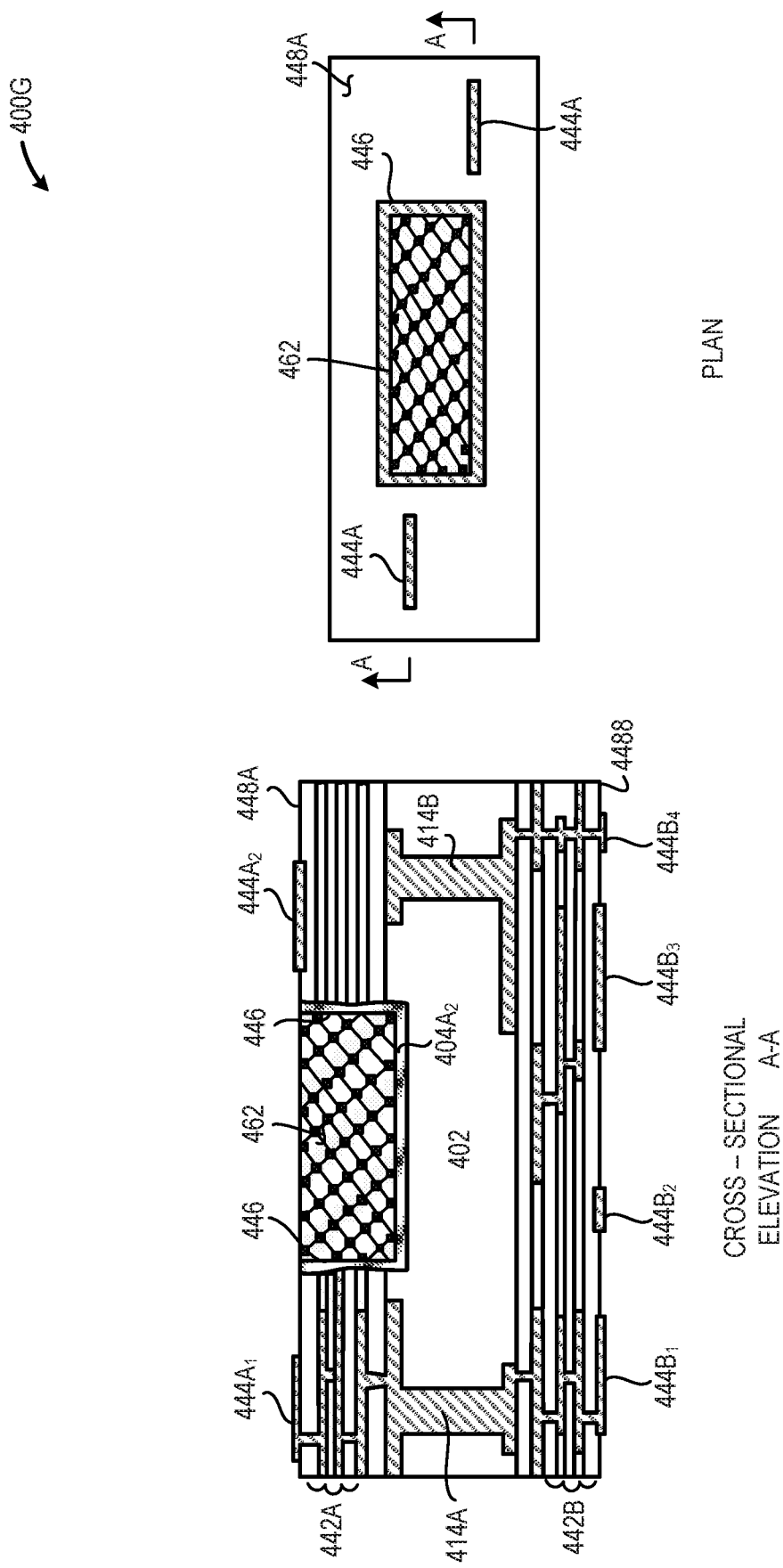
FIG. 4G includes plan and cross-sectional elevation views of the patterned conductive clad core depicted in FIG. 4F after the void formed the selective removal of at least a portion of the conductive material added in FIG. 4E is filled with one or more dielectric materials.

FIG. 4G depicts the patterned conductive clad core 400 of FIG. 4F after the void formed the selective removal of at least a portion of the conductive material 446 added in FIG. 4E is filled with one or more dielectric materials 462.

FIG. 4H depicts the patterned conductive clad core 400 of FIG. 4G after a conductive layer 472 is patterned, deposited, or otherwise formed over the dielectric material 462 added in FIG. 4G. As depicted in FIG. 4H, conductive layer 404A2 forms the bottom of the waveguide, conductive material 446 forms the sides of the waveguide, and the newly deposited conductive layer 472 forms the top portion of the waveguide.

Figure 5:
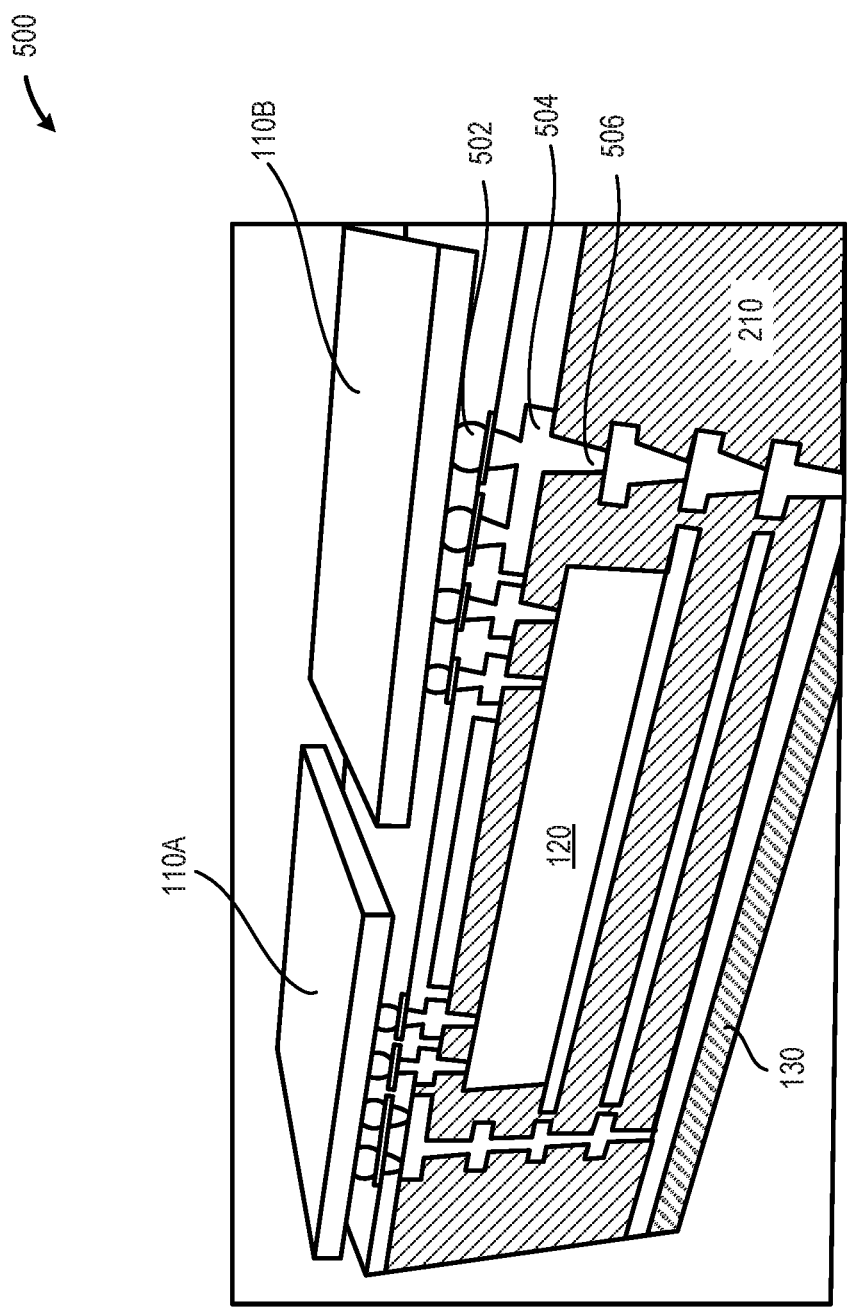
FIG. 5 is a cross-sectional perspective view of an illustrative semiconductor package that includes a first semiconductor die operably coupled to a second semiconductor die via one or more dielectric waveguides disposed in an interposer layer between the semiconductor dies and the semiconductor package substrate, in accordance with at least one embodiment described herein.

FIG. 5 depicts a cross-sectional perspective view of an illustrative semiconductor package 500 that includes a first semiconductor die 110A operably coupled to a second semiconductor die 110B via one or more waveguides 120 disposed in an interposer layer 210 between the semiconductor dies 110 and the semiconductor package substrate 130, in accordance with at least one embodiment described herein. As depicted in FIG. 5, the semiconductor dies 110 are physically and conductively coupled to the interposer layer 210. In embodiments, such physical and communicable coupling may be achieved using solder ball connections 502 such as depicted in FIG. 5. Other physical and/or communicable coupling methods may be used to couple the semiconductor dies 110 to the interposer layer 210.

The interposer layer 210 is physically and communicably coupled to the semiconductor package substrate via one or more communicable coupling methods such as soldering, surface mount techniques, and similar. Beneficially, since the interposer layer 210 is fabricated separate from the underlying semiconductor package substrate, different materials and/or manufacturing processes, some of which may be inapplicable to fabricating the semiconductor package substrate, may be used to manufacture and/or fabricate the interposer layer 210. The interposer layer includes a number of conductive structures, such as a number of conductive layers 504 and vias 506 that provide a conductive pathway from the semiconductor dies 110 to the underlying semiconductor package substrate 130.

Figure 6:
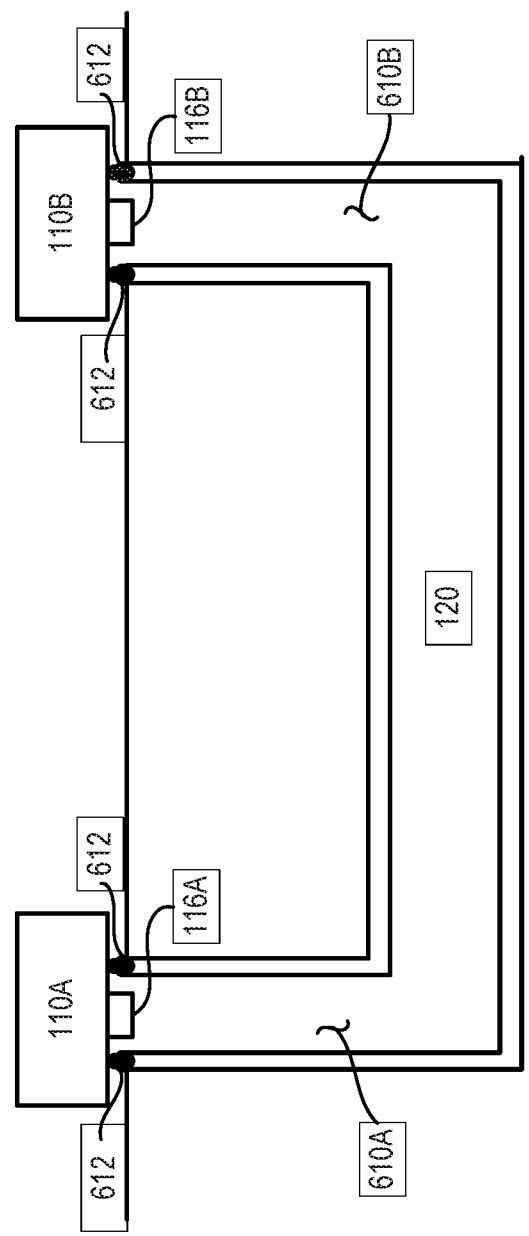
FIG. 6 is a cross-sectional elevation of an illustrative system that includes a waveguide having vertical extensions that conductively couple directly to connections on semiconductor die and semiconductor die, in accordance with at least one embodiment described herein.

FIG. 6 depicts a cross-sectional elevation of an illustrative system 600 that includes a waveguide 120 having vertical extensions 610A, 610B that conductively couple directly to connections 612 on semiconductor die 110A and semiconductor die 110B, in accordance with at least one embodiment described herein. The connections 612 may include ground connections, bumps, lands or similar conductive structures capable of directly or indirectly providing a ground connection for the waveguide structure. In some implementations, the RF-launchers 116A and 116B may be disposed in, on, about, or proximate at least a portion of a bottom surface of semiconductor die 110A and semiconductor die 110B, respectively. In some implementations, the system 600 may be partially or completely conformally coated and/or encapsulated in a material that provides an RF shield, thereby beneficially minimizing the likelihood of external RF interference.

Figure 7:
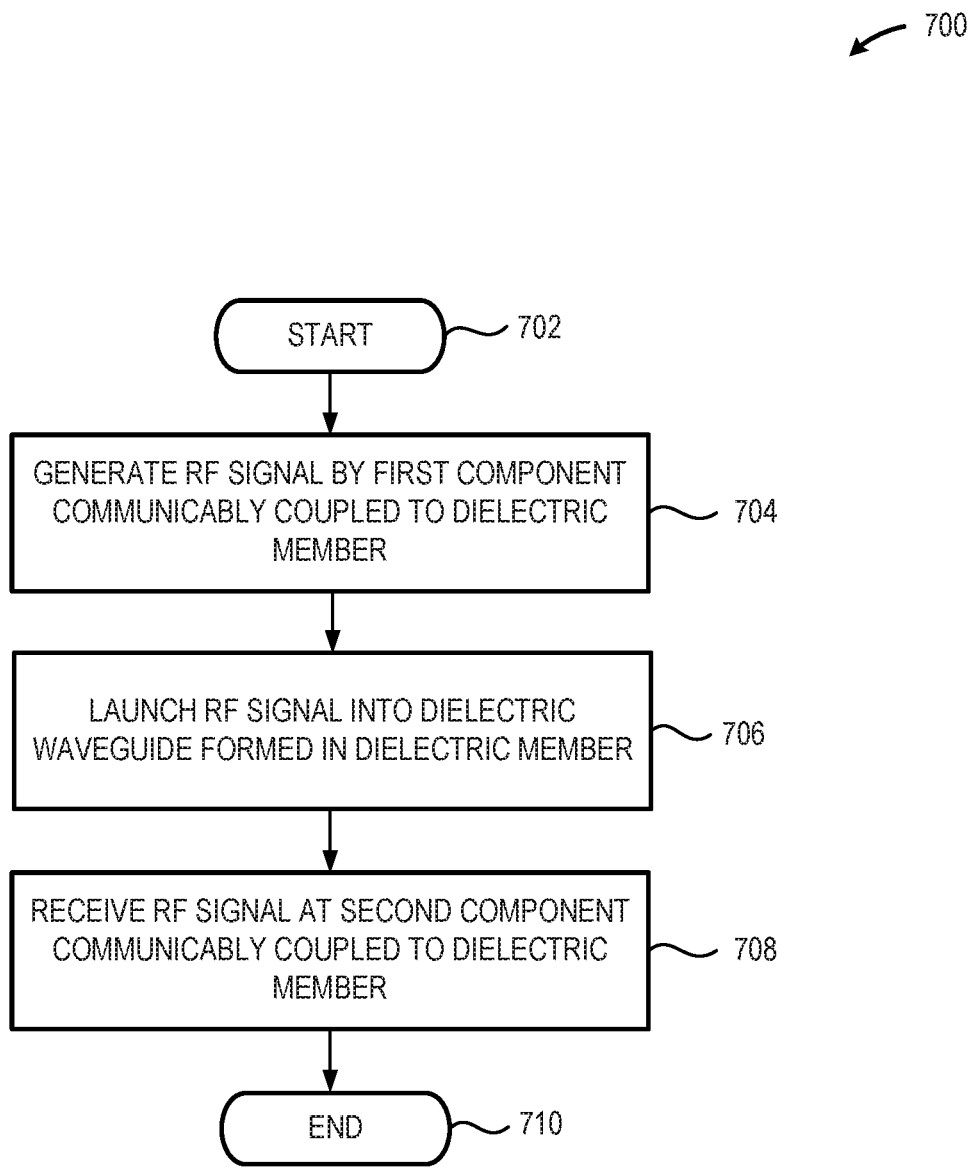
FIG. 7 is a high level flow diagram of an illustrative method of bidirectionally communicating information and/or data between a first semiconductor die and a second semiconductor die via RF-signals communicated though a waveguide formed in the semiconductor package substrate, in accordance with at least one embodiment described herein.

FIG. 7 depicts a high level flow diagram of an illustrative method 700 of bidirectionally communicating information and/or data between a first semiconductor die 110A and a second semiconductor die 110B via RF-signals communicated though a waveguide formed in the semiconductor package substrate, in accordance with at least one embodiment described herein. In some implementations, each of the semiconductor dies 110 may include a mm-wave die capable of generating at least one mm-wave signal at a frequency of from about 30 GHz to about 300 GHz. The use of mm-wave signals for communication between components 110 in a semiconductor package 100 beneficially permits reliable data transfer rates above those currently achievable using conductive traces or similar structures. The method 700 commences at 702.

At 704, a first semiconductor die 110A generates an RF signal. In some implementations, the first semiconductor die 110A may include a logic device 112, an RF-transceiver 114, and an RF-launcher 116 communicably coupled to a waveguide 120 formed or otherwise disposed at least partially in the substrate of the semiconductor package 100 or in an interposer layer 210 that is physically and communicably coupled to the semiconductor package 100. In some implementations the logic device 112 may include any device capable of generating or otherwise providing one or more output signals. In some implementations, the logic device 112 may include one or more processors, controllers, microprocessors, or similar devices operably coupled to a semiconductor package on a rack-mounted or blade server or storage device.

The RF signal may include information and/or data provided by the logic device 112 and modulated onto or otherwise combined with a high-frequency carrier signal by the RF-transceiver 114. In at least some implementations, the RF-transceiver 114 communicates the RF signal containing the information and/or data provided by the logic device 112 to an RF-launcher 116. In some implementations, the first semiconductor die 110A may generate the RF signal on a continuous, intermittent, periodic, or aperiodic basis.

In embodiments, the RF signal is a mm-wave signal having a frequency of from about 30 GHz to about 300 GHz. The first semiconductor die 110A may include a mm-wave transceiver 114 that receives the information and/or data from the logic device 112 and modulates or otherwise combines the received information and/or data with one or more mm-wave carrier signals. The mm-wave signal containing the modulated information and/or data is communicated to a mm-wave launcher 116 communicably coupled to the mm-wave transceiver 114.

At 706, the RF-signal is launched into a waveguide that is communicably coupled to the first semiconductor die 110A. In some implementations the RF-signal may be launched using an RF-launcher 116 communicably coupled to or integrated with the first semiconductor die 110A. In other implementations, the RF-signal may be launched using an RF-launcher that is at least partially disposed within the waveguide 120. The RF-launcher 116 may include, but is not limited to, a tapered slit launcher, a blade launcher, a cavity launcher, or similar. In some implementations, the RF-launcher may include a via or similar conductive structure disposed in the first semiconductor die 110A. In some implementations, the RF-launcher 116 may provide both a signal transmission device capable of launching RF signals to the waveguide 120 and a signal reception device capable of receiving RF signals from the waveguide 120.

In embodiments, the RF signal is a mm-wave signal and the RF-launcher 116 is a mm-wave launcher 116. In such implementations, the high frequency mm-wave signal containing the modulated information and/or data provided by the mm-wave die/transceiver 114 is launched by the mm-wave launcher 116 into the waveguide 120.

At 708, the RF-signal is received at a second semiconductor die 110B communicably coupled to the end of the waveguide 120 opposite the end to which the first semiconductor die 110A is coupled. In some implementations, the RF-launcher 116 coupled to the second semiconductor die 110B may receive the RF-signal from the waveguide 120 and forward the received signal to a communicably coupled RF-transceiver 114. The RF-transceiver 114 may demodulate the information and/or data carried by the RF signal and forward the information and/or data to a logic circuit 112 coupled to the second semiconductor die 110B. The method 700 concludes at 710.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a system for transmission of high frequency signals between semiconductor dies. The system may include a first semiconductor die that includes a first RF-transceiver capable of communicating on at least a first RF-frequency; a second semiconductor die that includes a second RF-transceiver capable of contemporaneously communicating on at least the first RF-frequency; and a dielectric member having at least one waveguide formed therein, where the waveguide communicably couples the first RF transceiver with the second RF transceiver; the waveguide a pathway for bidirectional communication between the first semiconductor die and the second semiconductor die at the first frequency; and the first semiconductor die and the second semiconductor die are physically coupled to the dielectric member at a location proximate the waveguide.

Example 2 may include elements of example 1 where the dielectric member may further comprise a first RF-launcher operably coupled to the first RF-transceiver; and where the dielectric member further comprises a second RF-launcher operably coupled to the second RF-transceiver.

Example 3 may include elements of example 2 where the first RF-transceiver and the second RF-transceiver are capable of contemporaneous communication using the first RF-frequency and a second RF-frequency; and where the waveguide provides a pathway for communication between the first semiconductor die and the second semiconductor die at both the first RF-frequency and the second RF-frequency.

Example 4 may include elements of example 2 where the dielectric member may include a dielectric substrate.

Example 5 may include elements of example 2 where the dielectric member may include an interposer layer physically and operably coupled between a dielectric substrate, the first semiconductor die, and the second semiconductor die.

Example 6 may include elements of example 5 where the interposer layer may include one of the following: a silicon interposer layer; an organic interposer layer; a glass interposer layer; and a ceramic interposer layer.

Example 7 may include elements of example 2 where the first RF-transceiver may include a mm-wave die capable of communicating on at least one frequency within a mm-wave frequency band, and where the second RF-transceiver may include a mm-wave die capable of bidirectionally communicating on the at least one frequency within a mm-wave frequency band.

Example 8 may include elements of example 7 where the mm-wave frequency band may include frequencies within a frequency band of from about 30 GHZ to about 300 GHz.

Example 9 may include elements of example 8 where the dielectric filled waveguide may include a waveguide at least partially filled with a solid dielectric material.

Example 10 may include elements of example 9 where the dielectric member may include a material having a first dielectric constant; where the solid dielectric material at least partially filling the dielectric filled waveguide may include a material having a second dielectric constant; and where the second dielectric constant is greater than the first dielectric constant.

Example 11 may include elements of example 2 where the dielectric filled waveguide may include an air-filled waveguide.

According to example 12, there is provided a method of wirelessly communicating between a first component and a second component disposed on a common semiconductor package. The method may include generating at least a first mm-wave signal by a first component operably and communicably coupled to a dielectric member; launching at least the first mm-wave signal into a waveguide formed in the dielectric member; and receiving the RF-signal at a second component operably and communicably coupled to the dielectric member.

Example 13 may include elements of example 12 where launching at least the first mm-wave signal into a waveguide formed in the dielectric member may include communicating, by the first component, at least the first mm-wave signal to a communicably coupled RF-launcher disposed proximate the waveguide; and launching, by the RF-launcher, at least the first mm-wave signal into the waveguide.

Example 14 may include elements of example 12 where generating at least a first mm-wave signal by a first component operably and communicably coupled to a dielectric member may include generating at least a first mm-wave signal having a frequency of from about 30 GHZ to about 300 GHz by the first component.

Example 15 may include elements of example 14 where generating at least a first mm-wave signal having a frequency of from about 30 GHZ to about 300 GHz by the first component may include generating a first mm-wave signal and a second mm-wave signal by the first component.

Example 16 may include elements of example 15 where generating a first mm-wave signal and a second mm-wave signal by the first component may include at least one of: generating a first mm-wave signal having a first polarization and a second mm-wave signal having a second polarization different from the first polarization; and generating a first mm-wave signal at a first RF-frequency and a second mm-wave signal at a second RF frequency different from the first RF-frequency.

Example 17 may include elements of example 16 where communicating, by the first component, at least the first mm-wave signal to a communicably coupled RF-launcher disposed proximate the waveguide may include contemporaneously communicating, by the first component, the first mm-wave signal and the second mm-wave signal to a communicably coupled mm-wave launcher disposed proximate the waveguide; and where launching, by the RF-launcher, at least the first mm-wave signal into the waveguide may include contemporaneously launching, by the mm-wave launcher, the first mm-wave signal and the second mm-wave signal into the waveguide.

Example 18 may include elements of example 13 where launching at least the first mm-wave signal into a waveguide formed in the dielectric member may include launching at least the first mm-wave signal into an air-filled waveguide formed in the dielectric member.

Example 19 may include elements of example 13 where launching at least the first mm-wave signal into a waveguide formed in the dielectric member may include launching at least the first mm-wave signal into a waveguide formed in the dielectric member; the dielectric member including a first dielectric material having a first dielectric constant; and the waveguide at least partially filled with a second dielectric material having a second dielectric constant that is greater than the first dielectric constant.

Example 20 may include elements of example 13 where generating at least a first mm-wave signal by a first component operably and communicably coupled to a dielectric member may include generating at least the first mm-wave signal by a first component operably and communicably coupled to an interposed member, the interposed member operably and communicably coupled between the first component and the semiconductor package.

Example 21 may include elements of example 20 where launching at least the first mm-wave signal into a waveguide formed in the dielectric member may include launching at least the first mm-wave signal into a waveguide formed in the interposed member.

According to example 22, there is provided a semiconductor package. The semiconductor package may include: a dielectric member having at least one waveguide formed therein, the waveguide including a first end and a second end; a first component that includes a first radio frequency (RF) transceiver, the first component operably and communicably coupled to the dielectric member, the first RF transceiver communicably coupled at the first end of the at least one waveguide; and a second component that includes a second RF transceiver, the second component operably and communicably coupled to the dielectric member, the second RF transceiver communicably coupled at the second end of the at least one waveguide.

Example 23 may include elements of example 22, and the semiconductor package may additionally include: a first RF-launcher system operably and communicably coupled to the first RF transceiver and disposed proximate the first end of the waveguide; and a second RF-launcher system operably and communicably coupled to the second RF transceiver and disposed proximate the second end of the waveguide.

Example 24 may include elements of example 23 where the first RF transceiver may include a first mm-wave transceiver; and where the second RF transceiver may include a second mm-wave transceiver.

Example 25 may include elements of example 24 where the dielectric member may include at least a portion of a substrate included in the semiconductor package.

Example 26 may include elements of example 24 where the dielectric member may include an interposed member operably and communicably coupled between a portion of a substrate dielectric member forming a portion of the semiconductor package, the first component, and the second component.

Example 27 may include elements of example 24 where the at least one waveguide may include at least one air-filled waveguide.

Example 28 may include elements of example 24 where the at least one waveguide may include a waveguide at least partially filled with a dielectric material.

Example 29 may include elements of example 28 where the dielectric member may include a dielectric material having a first dielectric constant; and where the dielectric material at least partially filling the waveguide may include a second dielectric material having a second dielectric constant, the second dielectric constant greater than the first dielectric constant.

According to example 30, there is provided a system for wirelessly communicating between a first component and a second component disposed on a common semiconductor package. The system may include: a means for generating at least a first mm-wave signal using a first component operably and communicably coupled to a dielectric member; a means for launching at least the first mm-wave signal into a waveguide formed in the dielectric member; and a means for receiving the RF-signal using a second component operably and communicably coupled to the dielectric member.

Example 31 may include elements of example 30 where the means for launching at least the first mm-wave signal into a waveguide formed in the dielectric member may include a means for communicating at least the first mm-wave signal to a communicably coupled RF-launcher disposed proximate the waveguide; and a means for launching at least the first mm-wave signal into the waveguide.

Example 32 may include elements of example 30 where the means for generating at least a first mm-wave signal by a first component operably and communicably coupled to a dielectric member may include a means for generating at least a first mm-wave signal having a frequency of from about 30 GHZ to about 300 GHz by the first component.

Example 33 may include elements of example 32 where the means for generating at least a first mm-wave signal having a frequency of from about 30 GHZ to about 300 GHz by the first component may include a means for generating a first mm-wave signal and a second mm-wave signal by the first component.

Example 34 may include elements of example 33 where the means for generating a first mm-wave signal and a second mm-wave signal by the first component may include at least one of: a means for generating a first mm-wave signal having a first polarization and a second mm-wave signal having a second polarization different from the first polarization; and a means for generating a first mm-wave signal at a first RF-frequency and a second mm-wave signal at a second RF frequency different from the first RF-frequency.

Example 35 may include elements of example 34 where the means for communicating, by the first component, at least the first mm-wave signal to a communicably coupled RF-launcher disposed proximate the waveguide may include a means for contemporaneously communicating, by the first component, the first mm-wave signal and the second mm-wave signal to a communicably coupled mm-wave launcher disposed proximate the waveguide; and where the means for launching, by the RF-launcher, at least the first mm-wave signal into the waveguide may include a means for contemporaneously launching, by the mm-wave launcher, the first mm-wave signal and the second mm-wave signal into the waveguide.

Example 36 may include elements of example 31 where the means for launching at least the first mm-wave signal into a waveguide formed in the dielectric member may include a means for launching at least the first mm-wave signal into an air-filled waveguide formed in the dielectric member.

Example 37 may include elements of example 31 where the means for launching at least the first mm-wave signal into a waveguide formed in the dielectric member may include a means for launching at least the first mm-wave signal into a waveguide formed in the dielectric member; where the dielectric member includes a first dielectric material having a first dielectric constant; and where a second dielectric material having a second dielectric constant that is greater than the first dielectric constant at least partially fills the waveguide.

Example 38 may include elements of example 31 where the means for generating at least a first mm-wave signal by a first component operably and communicably coupled to a dielectric member may include a means for generating at least the first mm-wave signal by a first component operably and communicably coupled to an interposed member, the interposed member operably and communicably coupled between the first component and the semiconductor package.

Example 39 may include elements of example 38 where the means for launching at least the first mm-wave signal into a waveguide formed in the dielectric member may include a means for launching at least the first mm-wave signal into a waveguide formed in the interposed member.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A system for transmission of mm-wave signals between semiconductor die, comprising:
    a first semiconductor die that includes a first RF-transceiver capable of communicating on at least a first mm-wave frequency;
    a second semiconductor die that includes a second RF-transceiver capable of contemporaneously communicating on at least the first mm-wave frequency; and
    a dielectric member having at least one waveguide therein, the dielectric member further comprising a plurality of conductive traces and vias vertically over the waveguide;
    wherein the waveguide communicably couples the first RF transceiver with the second RF transceiver;
    wherein the waveguide provides a pathway for bidirectional communication between the first semiconductor die and the second semiconductor die at the first mm-wave frequency; and wherein the first semiconductor die and the second semiconductor die are physically coupled to the dielectric member at a location proximate the waveguide.

2. The system of claim 1:
wherein the dielectric member further comprises a first RF-launcher operably coupled to the first RF-transceiver; and
wherein the dielectric member further comprises a second RF-launcher operably coupled to the second RF-transceiver.

3. The system of claim 2:
wherein the first RF-transceiver and the second RF-transceiver are capable of contemporaneous communication using the first mm-wave frequency and a second mm-wave frequency; and
wherein the waveguide provides a pathway for communication between the first semiconductor die and the second semiconductor die at both the first mm-wave frequency and the second mm-wave frequency.

4. The system of claim 2 wherein the dielectric member comprises a dielectric substrate.

5. The system of claim 4 wherein the dielectric member comprises an interposer layer disposed proximate the dielectric substrate.

6. The system of claim 5 wherein the interposer layer physically and operably couples between the dielectric substrate, the first semiconductor die, and the second semiconductor die.

7. The system of claim 2:
wherein the first RF-transceiver comprises a mm-wave die capable of bidirectional communication on at least one frequency within a mm-wave frequency band; and
wherein the second RF-transceiver comprises a mm-wave die capable of bidirectional communication on the at least one frequency within the mm-wave frequency band.

8. The system of claim 7 wherein the mm-wave frequency band comprises a frequency band of from about 30 GHZ to about 300 GHz.

9. The system of claim 8 wherein the waveguide comprises a waveguide at least partially filled with a solid dielectric material.

10. The system of claim 9:
wherein the dielectric member comprises a material having a first dielectric constant;
wherein the solid dielectric material at least partially filling the waveguide comprises a material having a second dielectric constant; and
wherein the second dielectric constant is greater than the first dielectric constant.

11. The system of claim 2 wherein the waveguide comprises an air-filled waveguide.

12. A method of communicating a mm-wave signal between a first semiconductor die and a second semiconductor die disposed on a common semiconductor package, the method comprising:
generating at least a first mm-wave signal by the first semiconductor die operably and communicably coupled to a dielectric member;
launching at least the first mm-wave signal into a waveguide formed in the dielectric member, the dielectric member further comprising a plurality of conductive traces and vias vertically over the waveguide; and
receiving the first mm-wave signal at the second semiconductor die operably and communicably coupled to the dielectric member.

13. The method of claim 12 wherein launching at least the first mm-wave signal into a waveguide formed in the dielectric member comprises:
communicating, by the first semiconductor die, at least the first mm-wave signal to a communicably coupled RF-launcher disposed proximate the waveguide; and
launching, by the RF-launcher, at least the first RF-signal into the waveguide.

14. The method of claim 12 wherein generating at least a first mm-wave signal by a first semiconductor die operably and communicably coupled to a dielectric member comprises:
generating at least a first mm-wave signal having a frequency of from about 30 GHZ to about 300 GHz by the first semiconductor die.

15. The method of claim 14 wherein generating at least a first mm-wave signal having a frequency of from about 30 GHZ to about 300 GHz by the first semiconductor die comprises:
generating a first mm-wave signal and a second mm-wave signal by the first semiconductor die.

16. The method of claim 15 wherein generating a first mm-wave signal and a second mm-wave signal by the first semiconductor die comprises at least one of:
generating a first mm-wave signal having a first polarization and a second mm-wave signal having a second polarization different from the first polarization; and
generating a first mm-wave signal at a first mm-wave frequency and a second mm-wave signal at a second mm-wave frequency different from the first mm-wave frequency.

17. The method of claim 16:
wherein communicating, by the first semiconductor die, at least the first mm-wave signal to a communicably coupled RF-launcher disposed proximate the waveguide comprises:
contemporaneously communicating, by the first semiconductor die, the first mm-wave signal and the second mm-wave signal to a communicably coupled mm-wave launcher disposed proximate the waveguide; and
wherein launching, by the RF-launcher, at least the first mm-wave signal into the waveguide comprises:
contemporaneously launching, by the mm-wave launcher, the first mm-wave signal and the second mm-wave signal into the waveguide.

18. The method of claim 13 wherein launching at least the first mm-wave signal into a waveguide formed in the dielectric member comprises:
launching at least the first mm-wave signal into an air-filled waveguide formed in the dielectric member.

19. The method of claim 13 wherein launching at least the first mm-wave signal into a waveguide formed in the dielectric member comprises:
launching at least the first mm-wave signal into a waveguide formed in the dielectric member;
the dielectric member including a first dielectric material having a first dielectric constant; and
the waveguide at least partially filled with a second dielectric material having a second dielectric constant that is greater than the first dielectric constant.

20. The method of claim 13: wherein launching at least the first mm-wave signal into a waveguide formed in the dielectric member comprises:
launching at least the first mm-wave signal into a waveguide formed in an interposer member disposed proximate the dielectric member.

21. The method of claim 20, wherein launching at least the first mm-wave signal into a waveguide formed in an interposer member disposed proximate the dielectric member comprises:

launching at least the first mm-wave signal into a waveguide formed in an interposer member disposed between the first semiconductor die and the dielectric member.

22. A semiconductor package comprising:

a dielectric member having at least one waveguide therein, the waveguide including a first end and a second end, and the dielectric member further comprising a plurality of conductive traces and vias vertically over the waveguide;

a first semiconductor die that includes a first radio frequency (RF) transceiver, the first semiconductor die operably and communicably coupled to the dielectric member, the first RF transceiver communicably coupled at the first end of the at least one waveguide; and a second semiconductor die that includes a second RF transceiver, the second semiconductor die operably and communicably coupled to the dielectric member, the second RF transceiver communicably coupled at the second end of the at least one waveguide.

23. A system for wirelessly communicating between a first semiconductor die and a second semiconductor die disposed on a common semiconductor package, the system comprising:

a means for generating at least a first mm-wave signal using a first semiconductor die operably and communicably coupled to a dielectric member;

a means for launching at least the first mm-wave signal into a waveguide in the dielectric member, the dielectric member further comprising a plurality of conductive traces and vias vertically over the waveguide; and a means for receiving the first mm-wave signal using a second semiconductor die operably and communicably coupled to the dielectric member.

24. The system of claim 23 wherein the means for launching at least the first mm-wave signal into a waveguide in the dielectric member comprises:

a means for communicating at least the first mm-wave signal to a communicably coupled RF-launcher disposed proximate the waveguide; and a means for launching at least the first mm-wave signal into the waveguide.

25. The system of claim 23 wherein the means for generating at least a first mm-wave signal by a first semiconductor die operably and communicably coupled to a dielectric member comprises:

a means for generating at least a first mm-wave signal having a frequency of from about 30 GHZ to about 300 GHz by the first semiconductor die.

* * * * *